United States Patent [19]
Ishihara

[11] Patent Number: 5,288,658
[45] Date of Patent: Feb. 22, 1994

[54] PROCESS FOR THE FORMATION OF AN AMORPHOUS SILICON DEPOSITED FILM WITH INTERMITTENT IRRADIATION OF INERT GAS PLASMA

[75] Inventor: Shunichi Ishihara, Ebina, Japan

[73] Assignee: Canon Kabushiki Kaisha, Tokyo, Japan

[21] Appl. No.: 888,159

[22] Filed: May 26, 1992

[30] Foreign Application Priority Data

May 24, 1991 [JP] Japan .................................. 3-148130

[51] Int. Cl.⁵ .......................................... H01L 21/20
[52] U.S. Cl. ................................... 437/101; 437/233; 437/967
[58] Field of Search .................. 437/101, 233, 967; 148/DIG. 1; 156/643

[56] References Cited

U.S. PATENT DOCUMENTS 5,049,523 9/1991 Coleman .............................. 437/101
5,108,778 4/1992 Suzuki et al. ........................ 156/646

Primary Examiner—Olik Chaudhuri
Assistant Examiner—H. Jey Tsai
Attorney, Agent, or Firm—Fitzpatrick, Cella, Harper & Scinto

[57] ABSTRACT

A process for forming a silicon-containing amorphous film on a substrate which comprises (a) step of depositing a silicon-containing amorphous film on said substrate and (b) step of irradiating plasma of inert gas to said silicon-containing amorphous film on deposited on the substrate in said step (a), wherein said step (a) and said step (b) are alternately repeated.

12 Claims, 7 Drawing Sheets

THE THICKNESS OF AN a-Si LAYER FORMED
DURING A PREDETERMINED PERIOD OF TIME(tD) (Å)

PROCESS FOR THE FORMATION OF AN AMORPHOUS SILICON DEPOSITED FILM WITH INTERMITTENT IRRADIATION OF INERT GAS PLASMA

BACKGROUND OF THE INVENTION

1. Field of The Invention

The present invention relates to an improved process for forming a large area amorphous silicon deposited film excelling in semiconductor characteristics which includes the step of intermittently irradiating inert gas plasma during film formation.

2. Related Background Art

As for the so-called amorphous silicon (a-Si in other words), there are various advantages, which cannot be attained in the case of a single crystal silicon, such that a film composed of a-Si (hereinafter referred to as a-Si film) can be formed not only on a glass substrate but also on other commercially available substrates at low substrate temperature; the a-Si film can be easily formed at large area; the a-Si film is superior to a film composed of the single crystal silicon (hereinafter referred to as single crystal Si film) with respect to light absorption; and the property of the a-Si film is isotropic but does not exhibit polarity. In addition, the a-Si film is free of grain boundary which is present in a polycystal silicon film has. Further as for the a-Si film, there is an advantage that it can be relatively easily produced at a reduced production cost.

In view of these advantages, there are a number of proposals to use an a-Si film as a constituent element in solar cells, in scanning circuits of image-reading devices such as line photosensors, area photosensors, etc., in TFTS, TFT arrays or matrices used not only in operation circuits of liquid crystal displays but also in switching circuits of photosensors, and electrophographic photosensitive members.

As the method of forming an amorphous silicon deposited film usable in such semiconductor devices, there are known or reported plasma CVD methods such as RF plasma CVD method (so-called glow discharge decomposition method), microwave plasma CVD method, etc., reactive sputtering method, light-induced CVD method, thermal-induced CVD method, vacuum evaporation method and electron cyclotron resonance CVD method.

In order to form an a-Si film to be used as a constituent semiconductor layer of an amorphous silicon semiconductor device by means of the plasma CVD technique using silane gas such as $SiH_4$, $Si_2H_6$, etc. as the film-forming raw material gas, it is generally recognized that the RF plasma CVD method and the microwave plasma CVD method are appropriate. The reactive sputtering method in which a Si-target is sputtered within Ar plasma in the presence of hydrogen gas is also recognized as being appropriate in order to form such a-Si film.

Other methods, that is, the light-induced CVD method, thermal-induced CVD method, vacuum evaporation method and electron cyclotron resonance CVD method, are practiced only in experimental scale but not employed in industrial scale.

Now, the a-Si films to be used in semiconductor devices which are formed according to these film-forming methods are mostly hydrogenated a-Si films containing 10 atomic % or above of hydrogen atoms. In other words, it is considered that a-Si films usable as the electronic constituent materials exhibiting the characteristics required for obtaining a-Si semiconductor devices are mostly those containing 10 atomic % or above of hydrogen atoms.

In order to form such a-Si films, the foregoing plasma CVD technique is widely used in various sectors since there are various advantages that the constitution of the apparatus used is relatively simple and can easily designed and the film-forming conditions can be relatively easily controlled. In the case of forming such a-Si film by means of the plasma CVD technique, the film formation is carried out, for example, in the following manner. That is, $SiH_4$ gas or $Si_2H_6$ gas (if necessary, diluted with hydrogen gas) as the film-forming raw material gas is introduced into a deposition chamber containing a substrate on which a film is to be formed, wherein energy of a high frequency of 13.56 MHz or 2.45 GHz is applied to cause plasma by which the film-forming raw material gas is decomposed to produce active species, thereby causing the formation of an a-Si deposited film on the substrate. In this case, the resulting a-Si film can be easily made to be of n-type or p-type by mixing an proper doping gas such as $PH_3$, $B_2H_6$, $BF_3$, etc. with the film-forming raw material gas.

In any case of forming an a-Si semiconductor film, it is known that especially the substrate temperature, among other film-forming parameters, greatly influences the quality of the resulting a-Si semiconductor film and it is extremely important to maintain the entire of a substrate uniformly at a predetermined temperature particularly in the case of forming a desirable a-Si semiconductor film of large area. However, it is very difficult to maintain all of a large area substrate uniformly at a predetermined temperature in order to form such large area a-Si semiconductor film especially by means of a plasma CVD method. That is, in the case of forming a desirable large area a-Si semiconductor film on a large area substrate, for example, of 100 mm to 1000 mm in size by means of the plasma CVD method, wherein the film formation is usually performed at a inner pressure of 0.1 to 1 Torr and at a predetermined substrate temperature in the range of 200° to 300° C., it is difficult to maintain the entire substrate of such large area size uniformly at said temperature under the condition of such low inner pressure and it takes a long period of time until the predetermined uniform substrate temperature is attained for the entire of the large area substrate. And in the case of repeatedly forming a large area a-Si semiconductor film while replacing the previous large area substrate by a new large area substrate in each film forming operation, it is difficult to maintain all of the new large area substrate uniformly at the identical substrate temperature in each case. In order to repeatedly form a desirable large area a-Si semiconductor film, other film-forming parameters than the above substrate temperature are necessary to be properly controlled so that uniform plasma is produced along the entire surface of a large area substrate on which the large area a-Si semiconductor film is to be formed in each film-forming operation. However, it is difficult to control those parameters uniformly in the respective film-forming operations. Thus, it is extremely difficult to mass-produce a desirable large area a-Si semiconductor film having a uniform film property at a high yield. Particularly, each of the resulting large area a-Si semiconductor films is liable to be such that is varied with respect to the film property all over the large area substrate, and the resulting large area a-Si semiconductor films become such that are varied with respect to the film property. This situation is problematic, for example, in the case of forming a multi-layered semiconductor device comprising a plurality of a-Si semiconductor films being stacked on a large area substrate. That is, it is difficult to mass-produce a desirable multi-layered semiconductor device each of which constituent a-Si semiconductor films having a uniform film property all over the large area substrate, which exhibits uniform characteristics and which is free of local occurrence of light deterioration (which is the so-called Stabler-Wronski effect) at a high yield, since to maintain all of the large area substrate uniformly at a predetermined temperature, to secure uniform distribution of plasma along the entire surface of the large area substrate and to secure uniformity of the film-forming conditions upon forming each of the constituent a-Si semiconductor films are difficult as above described.

Particularly, the local occurrence of light deterioration at the constituent a-Si semiconductor film is problematic even in the case where the above multi-layered semiconductor device is an image-reading device in which light having a relatively weak intensity is irradiated, but it is serious in the case where the above multi-layered semiconductor device is a solar cell in which sun light (which has a strong intensity) is irradiated. In the case where the above multi-layered semiconductor device is an electrophotographic photosensitive member, the problem relative to unevenness in the characteristics of the constituent a-Si semiconductor film leads to reproducing undesirable images which are not even in density or which are easily deteriorated. In the case where the above multi-layered semiconductor device is a thin film transistor (TFT), the problem relative to unevenness in the characteristics of the constituent a-Si semiconductor film makes the TFT such that does not exhibit uniform TFT characteristics. Similarly, in the case where a plurality of the above multi-layered semiconductor devices are arranged in matrix-like state to be a device used in the operation circuit of a liquid crystal display, the problem relative to unevenness in the characteristics of the constituent a-Si semiconductor film results in making said device such that it exhibits varied characteristics.

In order to solve the above problems caused by the a-Si semiconductor film formed by the conventional plasma CVD method, there is a proposal to improve its film property by subjecting the resultant a-Si semiconductor to after-treatment. For instance, the preliminary report for the 1988 Autumn Conference of the Applied Physics Association 5p-2f-1 and the preliminary report for the 1990 Spring Conference of the Applied Physics Association 31a-2D-8 & 31a-2D-11 report methods in which the previously formed a-Si film is subjected to repetition of $H_2$ plasma treatment. According to these methods, the a-Si film is crystallized as the $H_2$ plasma treatment is repeated, wherein the resulting Si film is not amorphous but crystalline. The Si crystalline film is advantageous depending upon application use, but the extent of its applicability is narrower than that of an a-Si film. As for the crystalline Si film, there are disadvantages such that it is inferior to the a-Si film with respect to light absorption; it is poor in uniformity because of having grain boundaries (the a-Si film is free of such problem); and it is not desirable to be used in light receiving devices. In addition to these disadvantages, there is also a disadvantage that uncontrollable crystallization is caused in the case of repeatedly treating the a-Si film with $H_2$ plasma.

Thus, the proposed methods are not effective in order to solve the foregoing problems in the prior art.

SUMMARY OF THE INVENTION

The principal object of the present invention is to overcome the foregoing problems in the prior art and to provide an improved film-forming process which enables one to effectively mass-produce a desirable a-Si semiconductor film having an improved uniformity in film property all over the entire film formed on a substrate.

Another object of the present invention is to provide an improved film-forming process which enables one to stably and repeatedly produce a large area a-Si semiconductor film having an improved uniformity in film property all over the entire film formed on a large area substrate.

A further object of the present invention is to provide an improved film-forming process which enables one to mass-produce an improved a-Si semiconductor device which is free of occurrence of light deterioration and which excels in photoresponse.

A further object of the present invention is to provide an improved film-forming process which enables one to mass-produce an improved a-Si semiconductor device which is free of occurrence of light deterioration and which exhibits an improved photoelectromotive force.

DETAILED DESCRIPTION OF THE INVENTION

Figure 1:
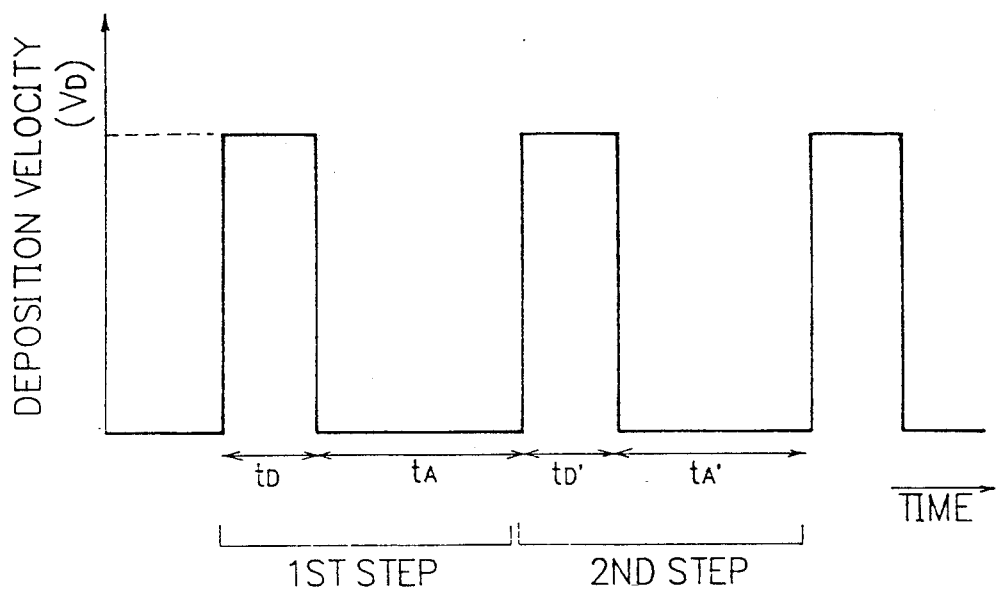
FIG. 1 is a schematic diagram illustrating an example of the film-forming process according to the present invention.

The present invention will be detailed by reference to the typical embodiments which are provided for illustrative purposes. The present invention is not restricted by these embodiments. These embodiments can be properly modified as long as the object of the present invention is attained.

The principal feature of the film-forming process according to the present invention which attains the foregoing objects comprises alternately carrying out the step of depositing an a-Si film on a substrate and the step of irradiating inert gas plasma to the previously formed a-Si film.

Particularly, the film-forming process according to the present invention is to form an a-Si semiconductor film on a substrate by alternately repeating the step of depositing an a-Si film on the substrate and the step of irradiating inert gas plasma to the a-Si film deposited on the substrate, wherein the a-Si film to be formed in the respective step of forming an a-Si film is controlled to be at least 10 Å and the temperature of the substrate at the time of carrying out the step of irradiating inert gas plasma to the a-Si film deposited is maintained at a temperature which is corresponding to or higher than the transition temperature (Tt) at which a change is caused in the hydrogen content of the a-Si film.

The inert gas plasma includes plasma produced from an inert gas such as He, Ne, Ar, Kr, Xe, etc.

In the present invention, a pronounced effect is provided in the case where a bias voltage is applied to the substrate side at least in the repetition step of irradiating inert gas plasma to the a-Si film deposited.

According to the film-forming process of the present invention, the foregoing problems in the prior art which are relative to localization of the film property of a large area a-Si semiconductor film formed on a large area substrate chiefly due to unevenness in distribution of the substrate temperature all over the substrate upon film formation are effectively eliminated and as a result, a desirable large area a-Si semiconductor film having a uniform film property all over the film and which is free of localization of the film property may be stably and repeatedly formed by means of the plasma CVD technique even in the case where uniform distribution of a predetermined temperature is not attained all over the entire of the substrate on which the a-Si semiconductor film is to be formed upon film formation and other film-forming conditions are not severely controlled. Hence, according to the film-forming method of the present invention, a large area multi-layered a-Si semiconductor device each of which constituent a-Si semiconductor films having a uniform film property all over the large area substrate, which exhibits uniform semiconductor characteristics and which is free of local occurrence of light irradiation can be mass-produced at an improved yield.

The present invention is particularly effective in the production of a large area a-Si semiconductor device such as a-Si solar cell, a-Si image reading device, a-Si electrophotographic photosensitive device or TFT array for use in the operation circuit of a liquid crystal display. The process of producing such large area a-Si semiconductor device includes a variety of steps, for example, cleaning of a large area substrate, formation of an electrode, formation of an a-Si semiconductor layer of p-type, i-type or n-type, lamination of these a-Si semiconductor layers, formation of a transparent electrode, pattering of the respective layer by means of photolithography for example, integration of devices, packaging, and the like. Among these steps in order to produce the foregoing large area a-Si semiconductor devices, extreme due care is necessary to be made for the step of forming an i-type a-Si film to be the i-type semiconductor layer since the resulting i-type semiconductor film often becomes one having varied characteristics due to occurrence of unexpected factors other than the foregoing problems relative to unevenness in the substrate temperature during the formation thereof. However, the present invention eliminates such problems and makes it possible to stably and repeatedly form a desirable i-type semiconductor film which exhibits uniform characteristics required for the i-type semiconductor film.

Explanation in more detail will be made of the film-forming process of the present invention.

The film-forming process of the present invention comprises repeatedly performing a first step (a) of depositing an a-Si film for a prescribed period of time ($t_D$) and a second step (b) of irradiating inert gas plasma to the a-Si film deposited in the step (a) for a prescribed period of time ($t_A$) alternately. This situation is schematically diagramed in FIG. 1 in which are shown said prescribed period of time during which the a-Si film formed in the respective repetition step (a) is shown by $t_D$ and $t_D'$, and said prescribed period of time during which the irradiation of inert gas plasma is carried out is shown by $t_A$ and $t_A'$. The repetition proceeding of the two steps (a) and (b) can be expressed by the following equations (1) and (2).

$$L = v_D \times t_D \times n \qquad (1)$$

$$t_r = (t_D \times t_A) \times n \qquad (2)$$

wherein, $v_D$ denotes a deposition rate during the prescribed period of time $t_D$, n denotes the number of repeated cycles of the steps (a) and (b), and L denotes a thickness of the resulting a-Si deposited film after repetition of the steps (a) and (b) "n" cycles.

The mean deposition rate $V_D$ can be expressed by the following equation (3).

$$v_D = L/t_T = t_D/(t_D + t_A) \times v_D \qquad (3)$$

wherein, $t_T$ denotes a period of time required for obtaining an a-Si deposited film having the thickness L.

In the film formation in practice, the respective values of L and $V_D$ are substantially the same as or slightly smaller than those calculated by the above equations.

The $t_D$, $v_D$ and $t_A$ in each repetition cycle comprising the steps (a) and (b) are not always limited to such simple example expressed by the above equations. That is, the $t_D$, $v_D$ and $t_A$ may be properly changed for each repetition cycle. Further, it is not always necessary for the $v_D$ to be constant. The $v_D$ may be a function of time.

Now, the surface of the a-Si deposited film formed on a substrate in the step (a) receives irradiation of inert gas plasma in the step (b). The mechanism of how the surface of the a-Si deposited formed on the substrate in the step (a) is treated by the inert gas plasma irradiated in the step (b) is not clear completely. But it is considered that ions and/or excited atoms of the-inert gas in the inert gas plasma irradiated collide with the surface of the a-Si deposited film to activate the lattice vibration of the surface of the a-Si deposited film, whereby causing release of excessive hydrogen atoms (H) and/or recombination or structural relaxation of the Si network.

The thickness I ($= v_D \times t_D$) of the a-Si film deposited during the $t_D$ is desired to be of about two atomic layers or more, and particularly, it is desired to be 10 Å or more. In the case where an a-Si film newly deposited in the step (a) is excessively thin, particularly for example, of a thickness of one atomic layer, the amorphous structure is hardly maintained, wherein the excessively thin a-Si deposited film is limitlessly crystallized with the irradiation of inert gas plasma in the step (b). It is almost impossible to control the crystallization degree in that case. In order to prevent the network of the a-Si deposited film from being excessively recombined and to effectively attain desirable structural relaxation for the a-Si deposited film in the step (b), the thickness of an a-Si film deposited in the step (a) prior to the step (b) is necessary to be at least 10 Å.

The a-Si film deposited during the $t_D$ in the respective repetition step (a) may partially contain microcrystalline Si as long as the a-Si film has a thickness of 10 Å or more. In this case, the a-Si deposited film partially containing microcrystalline Si will be structurally relaxed with the irradiation of inert gas plasma without being undesirably crystallized because said a-Si deposited film has a sufficient thickness of 10 Å or more.

In the case where the a-Si film deposited in the respective repetition step (a) is of a thickness exceeding 100 Å, the a-Si deposited film will not be structurally relaxed as expected with the irradiation of inert gas plasma in the successive repetition step (b), even though the irradiation of inert gas plasma is excessively performed.

The structural relaxation degree of the a-Si deposited film which is conducted in the respective repetition step (b) may be confirmed according to reduction in the content of hydrogen atoms of the film or reduction in the half-width of the peak at 480 cm$^{-1}$ in Raman spectrum of the film.

In view of the above, the thickness of the a-Si film deposited during the $t_D$ in the respective repetition step (a) is necessary to be less than 100 Å or most preferably, less than 50 Å.

In the case where a negative bias voltage is applied to the substrate upon irradiating inert gas plasma to the a-Si deposited film in the respective repetition step (b), it is possible for the a-Si film deposited in the respective repetition step (a) to be of a thickness which is 1.5 to 2 times thicker over the above defined thickness. The negative bias voltage applied here may be a self bias voltage of the inert gas plasma. In this case, such self bias voltage may be applied by floating the substrate from the earth.

One of the important factors in the film-forming process of the present invention is to maintain the substrate on which an a-Si semiconductor film is to be formed at a temperature which is corresponding to or higher than the transition temperature (Tt) at which a change is caused in the content of hydrogen atoms of the film.

Figure 2:
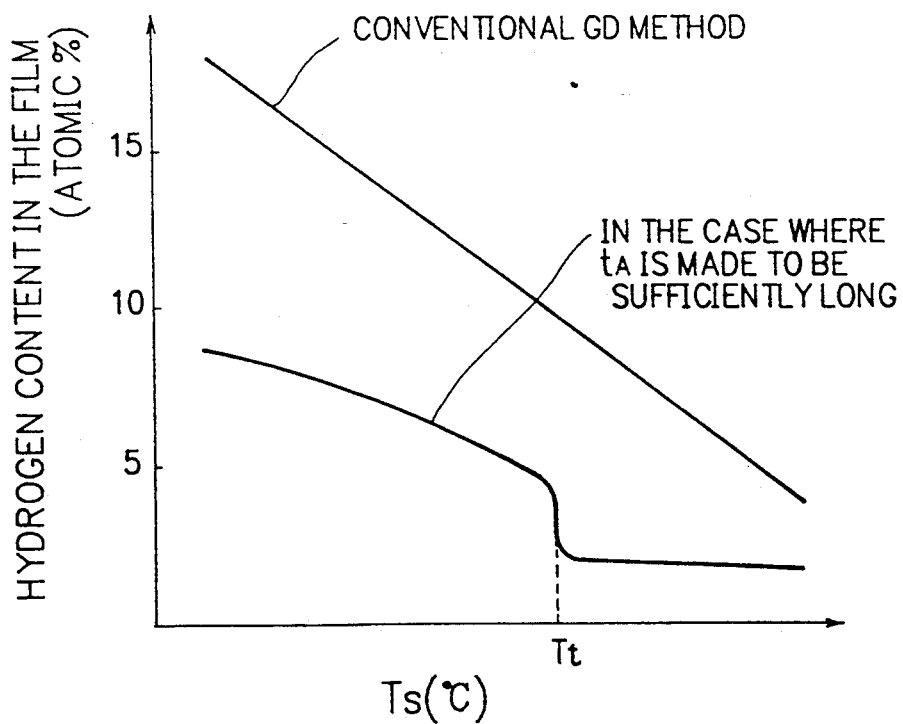
FIG. 2 shows a typical transition curve illustrating the interrelation between a prescribed irradiation period ($t_A$) of inert gas plasma, change in the substrate temperature (Ts) and the hydrogen content of an a-Si film formed according to the film-forming process of the present invention, in which is also shown a comparative transition curve showing the interrelation between change in the substrate temperature and the hydrogen content of an a-Si film formed according to the conventional glow discharge decomposition method (GD method).

FIG. 2 shows a transition curve illustrating the interrelation between the irradiation period of time ($t_A$) of inert gas plasma, change in the substrate temperature (Ts) and the hydrogen content of an a-Si film formed according to the film-forming process of the present invention. In FIG. 2, there is also shown a comparative transition curve illustrating the interrelation between change in the substrate temperature and the hydrogen content of an a-Si film formed according to the conventional glow discharge decomposition method (GD method).

As FIG. 2 illustrates, it is understood that when the $t_A$ (the period of time during which the irradiation of inert gas plasma in the respective repetition step (b)) is sufficiently prolonged, there appears a turning point which is not found in the film formation by the conventional GD method. It is considered that certain structural transition or certain change in the reaction mechanism has occurred at this turning point. But no distinct reason has been clarified yet for this. The important thing which can be understood from what shown in FIG. 2 is that the hydrogen content of an a-Si film formed in the substrate temperature region exceeding the transition temperature (Tt) is markedly lowered and the said hydrogen content does not substantially depend upon the substrate temperature in this region.

The present inventor experimentally found that an a-Si film formed in the substrate temperature region exceeding the transition temperature (Tt) is relatively low with respect to hydrogen content. And the a-Si film has a spin density of less than $10^{16}$ cm$^{-3}$ and has few dangling bonds (which means that the a-Si film has few defects in other words).

The present inventor obtained further findings through experiments. That is, (i) when the $t_A$ (the period of time during which inert gas plasma is irradiated to the a-Si film formed in the respective repetition step (a) in the respective repetition step (b)) is sufficiently prolonged, for example, to about 60 sec., there is afforded an a-Si film which contains hydrogen atoms in an amount of 5 atomic % or below with no increase in spin density; (ii) the hydrogen content of an a-Si film to be formed can be properly controlled to a desired value by properly controlling the $t_A$; When the $t_A$ is sufficiently prolonged, the quality of an a-Si film formed is not changed to such an extent as that found for an a-Si film formed by the conventional GD method in the case where the substrate temperature is changed, because the dependency of the hydrogen content of the film upon the substrate temperature is substantially slight in the substrate temperature region exceeding the transition temperature (Tt) as apparent from what shown in FIG. 2; According the resulting a-Si film has a uniform film property all over the film is free of occurrence of light deterioration (the so-called Stable-Wronski effect) and exhibits a desirable electric conductivity which is greater than that of an a-Si film formed by the conventional GD method. Therefore, (iii) even in the case of forming a large area a-Si semiconductor film on a large area substrate, which is liable to cause uneven distribution of the substrate temperature upon film formation, in order to produce a desirable large area multi-layered a-Si semiconductor device, each of which constituent a-Si semiconductor films having a uniform film property all over the large area substrate, which exhibits uniform semiconductor characteristics and which is free of local occurrence of light deterioration can be mass-produced at an improved yield.

As for the transition temperature (Tt), it is occasionally somewhat different depending upon the constitution of the apparatus used or/and the film-forming conditions employed. However in general, since there appears a transition region with respect to hydrogen content of the film as shown in FIG. 2 when the $t_A$ (the period of time during which inert gas plasma is irradiated to the a-Si film formed in the step (a)) is made to be 30 seconds or more, the concrete value of the Tt is determined and the film formation is carried out at a substrate temperature situated in the substrate temperature region exceeding the predetermined transition temperature. Specifically, the transition temperature may be a low temperature of about 250° C., but in general, it is made to be about 300° C.

As previously described, when the thickness of an a-Si film deposited during the prescribed period of time $t_D$ in the step (a) is made to be less than 10 Å, the a-Si film becomes markedly crystallized in the step (b). In order to more clarify this situation, the following film-formation experiments were conducted. That is, (1) there were prepared a plurality of silicon film samples having a thickness of about 1 um by repeating the film-forming cycle comprising the step (a) of depositing an a-Si film and the step (b) of irradiating inert gas plasma under the film-forming conditions capable of affording a silicon film comprised of amorphous phase only, wherein the prescribed period of time ($t_D$) (that is, thickness of the resulting film in other words) was changed in each case; and (2) there were prepared a plurality of silicon film samples having a thickness of about 1 um by repeating the film-forming cycle comprising the step (a) of depositing an a-Si film and the step (b) of irradiating inert gas plasma under the film-forming conditions capable of affording a silicon film comprised of amorphous phase and crystalline phase, wherein the prescribed period of time ($t_D$) (that is, thickness of the resulting film in other words) was changed in each case.

It is known that it is possible to recognize the crystallinity of a deposited film by observing a signal peak at 520 cm$^{-1}$ belonging to a crystalline phase and a signal peak at 480 cm$^{-1}$ belonging to an amorphous phase in a Raman spectrum obtained as for the deposited film.

Therefore, as for each of the resultant silicon film samples obtained in the above (1) and (2), its crystallinity was examined as to whether the film comprises an amorphous phase, crystalline phase or both of said two phases by observing a signal peak at 520 cm$^{-1}$ resulting from the crystalline phase and a signal peak at 480 cm$^{-1}$ resulting from the amorphous phase in a Raman spectrum obtained as for the silicon film.

Figure 3:
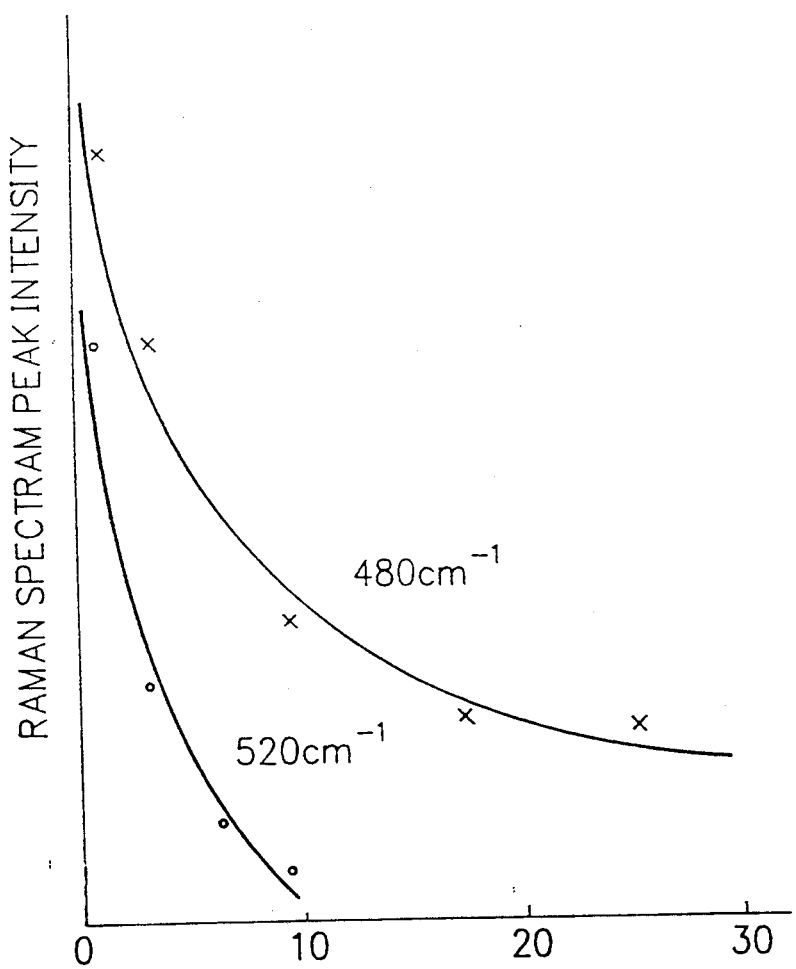
FIG. 3 shows two typical curves respectively illustrating the interrelation between the thickness of an a-Si film deposited during a prescribed deposition period and the ratio between a peak belonging to crystal material and a peak belonging to amorphous material in the Raman spectrum of said a-Si film.

The observed results obtained were graphically shown in FIG. 3, in which the mark "o" concerns the condition under which an a-Si film comprising amorphous phase only was formed, and the mark "x" concerns the condition under which a Si film comprising amorphous phase and crystalline phase was formed.

From what shown in FIG. 3, it was found that the thickness of an a-Si film formed during the $t_D$ in the respective repetition step (a) is necessary to be at least 10 Å in order to make the a-Si film formed in each repetition cycle to be identical.

It was also found that an a-Si film comprised of amorphous phase only, which is free of crystalline phase, is formed in the respective repetition step (a) as long as it is formed under the film-forming conditions capable of affording an a-Si film while controlling the thickness of the resulting film to at least 10 Å.

Then, as a result of further experimental studies, the following were found. That is, as long as the thickness of an a-Si film deposited on the substrate in the respective repetition step (a) is at least 10 Å, the hydrogen content of the a-Si film can be properly controlled by regulating the $t_A$ while maintaining the substrate at a substrate temperature corresponding to or exceeding the transition temperature Tt shown in FIG. 2. Where the $t_A$ is properly prolonged, the quality of the resulting a-Si film hardly depends upon the substrate temperature but also slightly depend upon the film formation period of time; and as a result, there can be stably and repeatedly produced a high quality a-Si semiconductor film with a reduced hydrogen content which is low in spin density, excels in carrier transportation characteristics, and is free of light deterioration.

Figure 4:
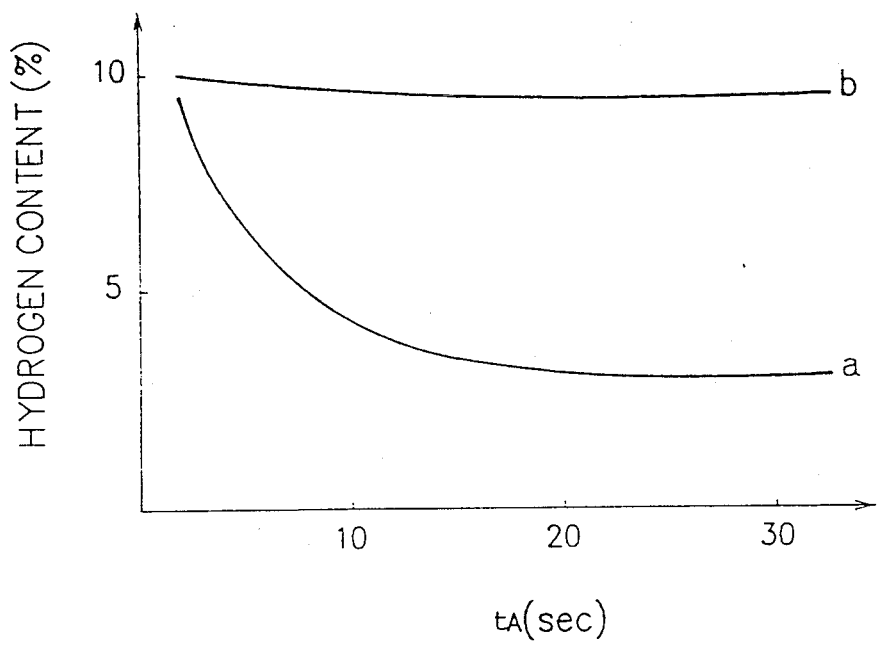
FIG. 4 shows two experimentally obtained curves respectively illustrating the interrelation between the period of time during which irradiation of inert gas plasma is performed and the hydrogen content of an a-Si film formed.

Shown in FIG. 4 are of the interrelation between the $t_A$ (the period of time during which inert gas plasma is irradiated to the a-Si film) and the hydrogen content with respect to the film formed by repeating the film formation cycle comprising the step (a) of depositing an a-Si film on a substrate and the step (b) of irradiating inert gas plasma to the a-Si film.

The line a in FIG. 4 is of the results obtained in the case where the above film formation cycle was repeated to obtain an a-Si film of about 1 um in thickness while maintaining the thickness of an a-Si film formed in the respective repetition step (a) at 30 Å and changing the $t_A$ (the period of time during which inert gas plasma is irradiated in the respective repetition step (b)).

The line b in FIG. 4 is of the results obtained in the case where the above film formation cycle was repeated to obtain an a-Si film of about 1 um in thickness while maintaining the thickness of an a-Si film formed in the respective repetition step (a) at 150 Å and changing the $t_A$ (the period of time during which inert gas plasma is irradiated in the respective repetition step (b)).

As a result of studies based on what shown in FIG. 4, the following were found. That is, in the case where the thickness of an a-Si film formed in each film formation cycle is made to be as large as more than 100 Å (that is, in the case of the line b in-FIG. 4), the hydrogen content of the a-Si film finally obtained is not reduced (this means that no distinguishable effect is provided by the step (b) of irradiating inert gas plasma), the hydrogen content of the a-Si film formed relatively depends upon the substrate temperature, and the resulting a-Si film is more or less around the same as that of an a-Si film formed by the conventional GD method, which is not satisfactory especially with respect to light deterioration. On the other hand, in the case of the line a in FIG. 4, the hydrogen content of an a-Si film in each film formation cycle is desirably reduced as long as the substrate temperature upon film formation is maintained at a temperature corresponding to or exceeding the transition temperature Tt (see, FIG. 2) wherein the said hydrogen content substantially does not depend upon the substrate temperature, and as a result, there is afforded a desirable a-Si semiconductor film which is free of light deterioration.

In view of the above experimental results, it was found that in order to obtain an a-Si semiconductor film with a reduced hydrogen content which is free especially of light deterioration by repeating the film formation cycle comprising the step (a) of depositing an a-Si film on a substrate and the step (b) of irradiating inert gas plasma to the a-Si film, it is desired for the thickness of the a-Si film formed in the respective repetition step (a) to be less than 100Å or preferably, less than 50 Å.

Now, the mean deposition rate $V_D$ of the a-Si film formed in the respective repetition step (a) depends upon the thickness of the said a-Si film as apparent from the foregoing equation (3). The period of time $t_A$ or $t_A'$ (see, FIG. 1) during which the respective repetition step (b) of irradiating inert gas plasma to the a-Si film formed in the preceding step (a) does not concern the film deposition. In order to increase the deposition rate of the a-Si film, it is desirable to thicken the a-Si film formed in the respective repetition step (a). However, it is difficult to increase the mean deposition rate $V_D$ without reducing the property of an a-Si film formed in the respective repetition step (a) in the case where the thickness of the said a-Si film is made to be a relatively small value.

It was found through experiments that such difficulty can be effectively eliminated in the case of applying a bias voltage to the substrate side upon performing the respective repetition step (b), wherein a desirable a-Si film having such thickness can be formed without reducing the film property.

Figure 5:
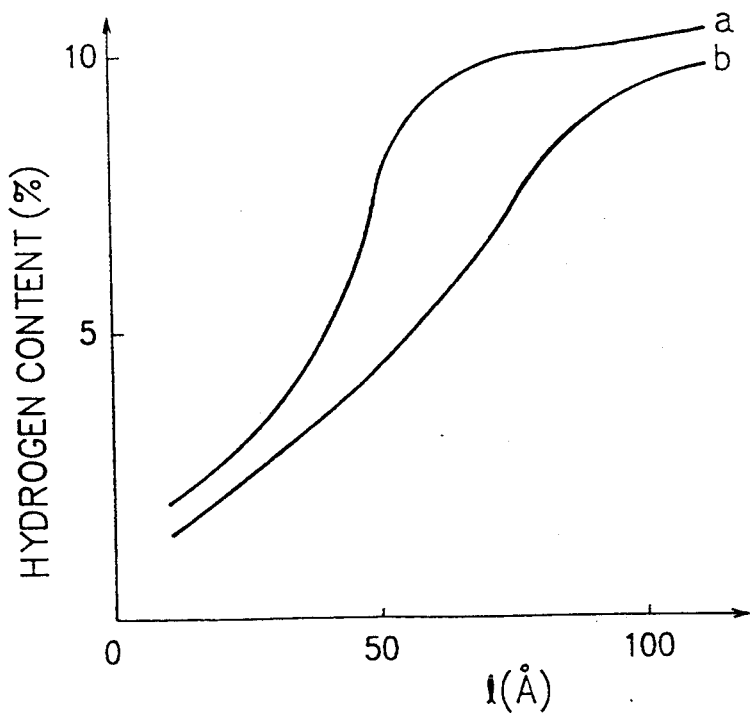
FIG. 5 shows two experimentally obtained curves respectively illustrating the thickness of an a-Si film formed while applying a bias voltage upon irradiating inert gas plasma and the hydrogen content of the a-Si film.

Shown in FIG. 5 are of the interrelation between the thickness 1 ($=v_D \times t_D$) of an a-Si film deposited in the respective repetition step (a) and the hydrogen content with respect to the film formed by repeating the film formation cycle comprising the step (a) of depositing an a-Si film on a substrate and the step (b) of irradiating inert gas plasma to the a-Si film while applying a bias voltage to the substrate.

The line a in FIG. 5 is of the results obtained in the case where the above film formation cycle was repeated to obtain an a-Si semiconductor film of about 1 um in thickness while maintaining the substrate at a temperature higher than the Tt (transition temperature)(see, FIG. 2), making the $t_A$ (the period of time during which the respective repetition step (b) is performed) constant at 20 seconds, changing the $t_D$ (the period of time during which the respective repetition step (a) is performed), and applying a bias voltage to the substrate side wherein the substrate was electrically grounded in the respective repetition step (b).

The line b in FIG. 5 is of the results obtained in the case where the above film formation cycle was repeated to obtain an a-Si semiconductor film of about 1 um in thickness while maintaining the substrate at a temperature higher than the Tt (transition temperature)(see, FIG. 2), making the $t_A$ (the period of time during which the respective repetition step (b) is performed) constant at 20 seconds, changing the $t_D$ (the period of time during which the respective repetition step (a) is performed), and applying a bias voltage of $-75$ V to the substrate in the respective repetition step (b).

From what shown in FIG. 5, it was found that the effect of irradiating inert gas plasma is provided even in the region wherein the i is relatively large in the case of applying a bias voltage applied upon performing the respective repetition step (b). And it was also found that a desirable a-Si semiconductor film excelling in semiconductor characteristics is afforded even in the case of making the thickness of an a-Si film formed in the respective repetition step (a) to be relatively greater as long as a bias voltage is applied to the substrate upon performing the respective repetition step (b).

The repetition step (a) of depositing an a-Si film on a substrate in the present invention may be performed by a plasma CVD method such as RF plasma CVD method (RF glow discharge decomposition method), microwave plasma CVD method, etc. However, other film-forming methods such as light-induced CVD method, electron cyclotron resonance plasma CVD method (ECR plasma CVD method), reactive sputtering method using gas containing $H_2$ gas, etc. may be also employed in order to perform the repetition step (a) of depositing an a-Si film.

The repetition step (b) of irradiating inert gas plasma to the a-Si deposited film formed in the repetition step (a) in the present invention may be performed by means of a conventional plasma-irradiating technique. The important factor at the time of irradiating inert gas plasma to the deposited film is to supply ions of inert gas (hereinafter referred to as inert gas ions) and/or excited atoms of inert gas (hereinafter referred to as inert gas atoms) to the surface of the a-Si deposited film, wherein luminescent portion of the inert gas plasma is not necessary to be in contact with the surface of the a-Si deposited film. As the simplest method of irradiating inert gas plasma to the a-Si deposited film, there can be mentioned a method of carrying out high frequency glow discharging (RF glow discharging) with a capacitive coupling system or an inductive coupling system under the condition of about 100 mtorr for the inner pressure. The repetition step (b) of irradiating inert gas plasma to the a-Si deposited film by means of the above glow discharging technique is performed, for example, by placing the substrate having an a-Si film thereon (said a-Si film having been deposited in the repetition step (a)) prior to the repetition step (b)) in or in the vicinity of glow discharge plasma produced from inert gas, whereby supplying ions and/or excited atoms of the inert gas to the surface of the a-Si film deposited on the substrate. Other than these glow discharge plasma irradiating methods, there may be optionally employed a method of producing inert gas plasma with the use of microwave energy and diffusing said inert gas plasma to the surface of the a-Si film formed on the substrate or an method with the use of an ECR technique wherein inert gas plasma is produced and said inert gas plasma is irradiated to the surface of the a-Si film formed on the substrate utilizing magnetic field.

In the case of performing the repetition step (a) of depositing an a-Si film on the substrate by means of a plasma CVD technique using a plasma CVD apparatus, it is possible to perform the repetition step (b) of irradiating inert gas plasma to the a-Si film formed in the step (a) in the identical plasma CVD apparatus. In this case, a pronounced effect is provided if a rare gas (inert gas) is used in the repetition step (a) of depositing an a-Si film. That is, the repetition step (b) can be properly performed by simply suspending the introduction of a film-forming raw material gas such as $SiH_4$, $Si_2H_6$, etc. used in the step (a) upon performing the step (b); and the successive repetition step (a) can be properly performed by simply resuming the introduction of said film-forming raw material gas. In this case, a due care should be made of the ratio between the film-forming raw material gas and the rare gas (inert gas) upon performing the repetition step (a). That is, in the case where the ratio of the film-forming raw material gas to the rare gas (inert gas) is excessively reduced upon performing the repetition step (a), residual rare gas (inert gas) is often contaminated into the resulting a-Si film and as a result, the resulting a-Si film becomes such that is poor in film property. In view of this, the concentration of the film-forming raw material gas upon performing the repetition step (a) is desired to be controlled to preferably 30 % or above or more preferably, 50 % or above. It is possible to continuously maintain the inert gas plasma in the two repetition steps (a) and (b). In this case, deposition of an undesirable a-Si film which is liable to occur at the beginning stage of causing discharge plasma can effectively prevented.

Further, the repetition step (a) of depositing an a-Si film on a substrate and the repetition step (b) of irradiating inert gas plasma to the a-Si film can be independently controlled one from the other by differentiating the concentration of the rare gas (inert gas) or/and the high frequency power applied in each of the repetition steps (a) and (b). In this case, a more desirable annealing effect is provided to the a-Si film to be treated in the repetition step (b).

There is not a particular limitation for the discharging conditions upon performing the repetition step (b) of irradiating inert gas plasma to an a-Si film. However, in the case where the power applied for causing discharge is excessively low, sufficient excited atoms are not generated, and unless the $t_4$ is considerably prolonged, desirable effects by the irradiation of inert gas plasma are not provided.

The important thing in the repetition step (b) is to sufficiently supply ions and/or excited atoms of the rare gas (inert gas) to the surface of the a-Si film deposited on the substrate in the repetition step (a) as previously described. This can be attained in the range of the conventional discharge conditions.

In the case of applying the bias voltage to the substrate having an a-Si film thereon upon performing the repetition step (b) of irradiating inert gas plasma to the a-Si film, the bias voltage may be a self bias voltage of the inert gas plasma. In this case, such self bias voltage may be applied by floating the substrate from the earth. Other than this, the bias voltage may be a bias voltage applied from an external power source capable of outputting said bias voltage.

DESCRIPTION OF THE PREFERRED EMBODIMENTS

The present invention will be described in more detail with reference to the following examples, which are not intended to restrict the scope of the invention.

Example 1

Figure 6:
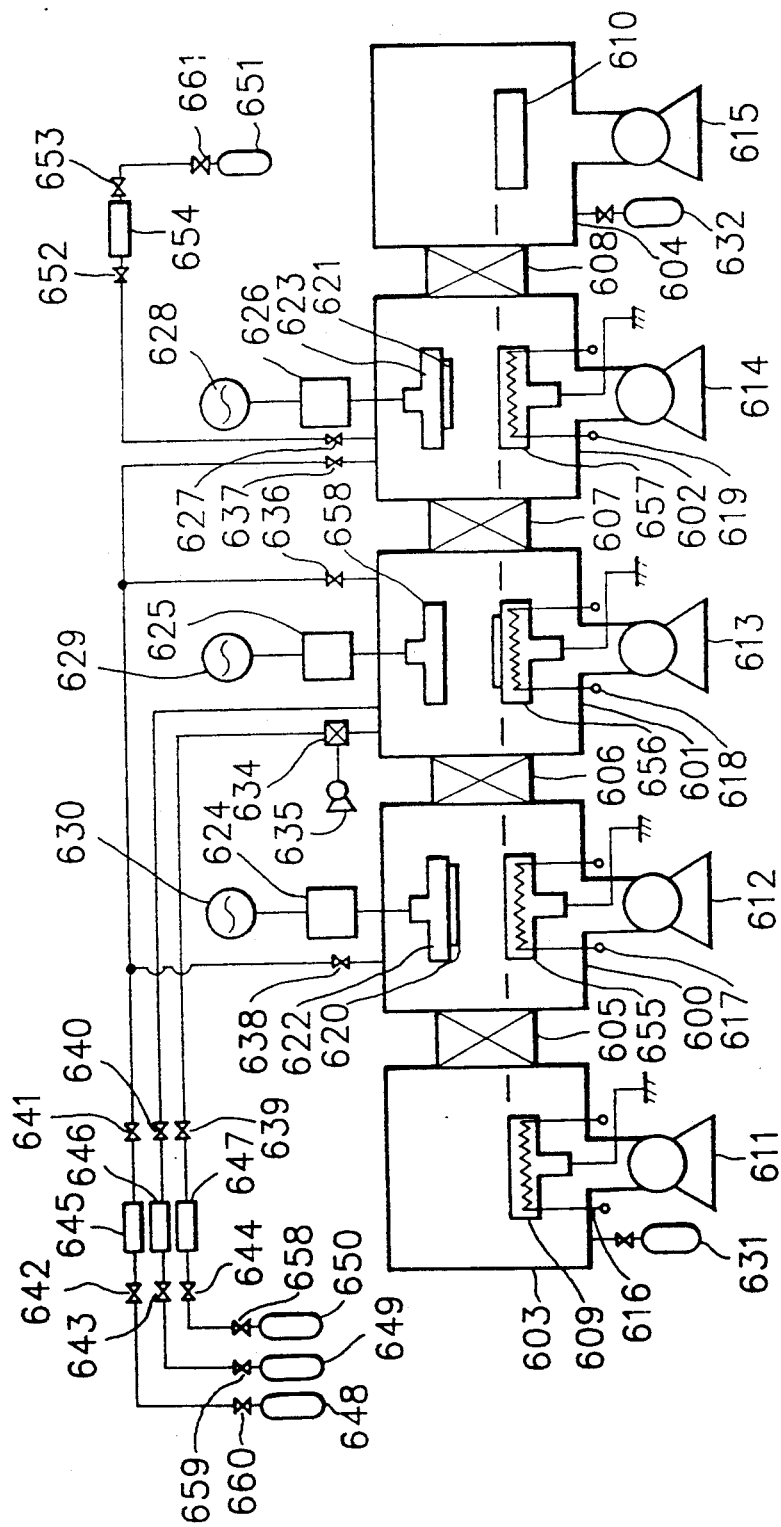
FIG. 6 is a schematic diagram of an example of the film-forming apparatus which is suitable for practicing the process of the present invention.
Figure 7:
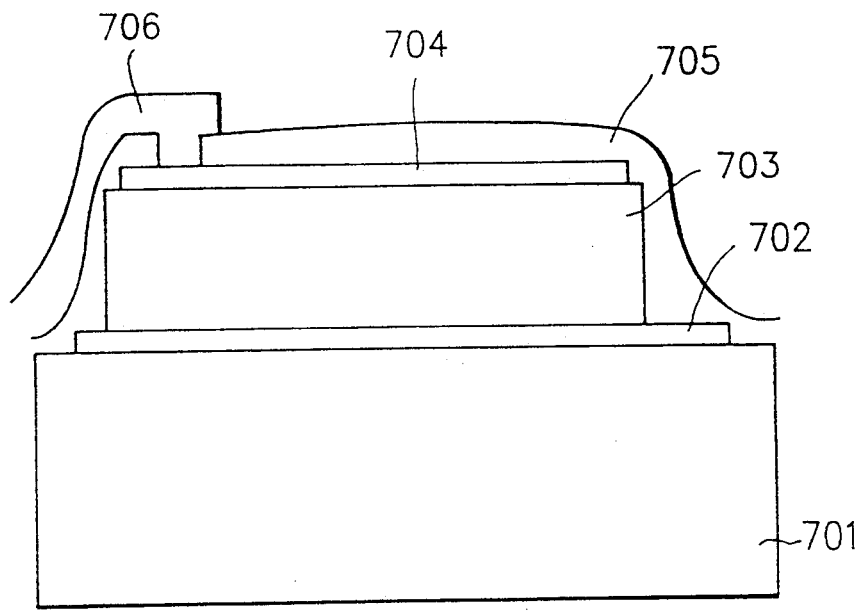
FIG. 7 is a schematic cross-section view illustrating the constitution of an element of a Schottky barrier type image-reading sensor formed according to the process of the present invention.

There was prepared a schottky-barrier type image-reading sensor of 161 p/mm in element density and 300 mm in length comprising a plurality of semiconductor elements each having the constitution shown in FIG. 7, using the fabrication apparatus shown in FIG. 6.

The constituent semiconductor element of the schottky-barrier type image-reading sensor shown in FIG. 7 comprises substrate 701, electrode layer 702 disposed on the substrate 701, semiconductor layer 703 disposed on the electrode layer 702 and transparent and conductive layer 704 disposed on the semiconductor layer 703. Numeral reference 705 stands for a passivation film and numeral reference 706 stands for a wiring.

The fabrication apparatus shown in FIG. 6 comprises three film-forming vacuum chambers 600, 601 and 603 being arranged between a substrate supply vacuum chamber 603 and a substrate taking-out vacuum chamber 604. Each of these vacuum chambers is provided with an exhausting pump 611, 612, 613, 614 or 615. The substrate supply vacuum chamber 603 is so structured that a substrate can be introduced therein while maintaining the vacuum of each of the film-forming vacuum chambers 600, 601 and 602. Similarly, the substrate taking-out vacuum chamber is so structured that a substrate can be taken out while maintaining the vacuum of each of the film-forming vacuum chambers 600, 601 and 602.

Each of numeral references 605, 606, 607 and 608 stands for a gate valve for isolating the adjacent two vacuum chambers.

The fabrication apparatus shown in FIG. 6 is provided with a transportation mechanism (not shown in the figure) capable of transporting the substrate from one vacuum chamber to the other vacuum chamber.

Each of numeral references 609, 655, 656, 657 and 610 stands for a substrate holder. Each of the substrate holders 609, 655, 656 and 657, other than the substrate holder 610, is so designed that it serves as an electrode. And each of the substrate holders 609, 655, 656 and 657 is provided with an electric heater 616, 617, 618 or 619 which serves to heat the substrate. Numeral reference 631 stands for a reservoir containing $N_2$ gas which is connected to the substrate supply vacuum chamber 603. Numeral reference 632 stands for a reservoir containing $N_2$ gas which is connected to the substrate taking-out vacuum chamber 604. The reservoir 631 is used to supply $N_2$ gas into the substrate supply vacuum chamber 603 when the vacuum chamber is opened upon introducing the substrate thereinto. The reservoir 632 is used to supply $N_2$ gas into the substrate taking-out vacuum chamber 604 when the vacuum chamber is opened upon taking out the substrate therefrom. Each of numeral references 622, 658 and 623 stands for a high frequency electrode. Numeral reference 620 stands for a Cr-target disposed on the high frequency electrode 622. Numeral reference 621 stands for an ITO-target disposed on the high frequency electrode 623. Each of numeral references 624, 625 and 626 stands for a matching box. Each of numeral references 628, 629 and 630 stands for a high frequency power source of 13.56 MHz. Each of numeral references 627, 636, 637, 638, 639, 640, 641, 642, 643, 644, 652, 653, 658, 659, 660 and 661 stands for a valve for the gas pipying. Numeral reference 634 stands for a three-way valve capable of switching the route to the film-forming vacuum chamber 601 from the route to a gas line exhaust pump 635 serving to stabilize the gas flow rate. Each of numeral references 645, 646, 647 and 654 stands for a mass flow controller. Numeral reference 648 stands for a reservoir containing Ar gas. Numeral reference 649 stands for a reservoir containing $H_2$ gas. Numeral reference 650 stands for a reservoir containing $SiH_4$ gas. Numeral reference 651 stands for a reservoir containing $O_2$ gas.

The shottity-barrier type image-reading sensor was prepared using the above fabrication apparatus as follows.

A well-cleaned glass plate (Corning glass plate No. 7059 produced by Corning Glass Company) as the substrate 701 was introduced into the substrate supply vacuum chamber 603, and the chamber was evacuated to a predetermined vacuum degree. The electric heater 616 was switched on to heat the substrate to 150° C., followed by transferring the substrate into the film-forming vacuum chamber 600, wherein a Cr film as the electrode layer 702 was formed on the substrate (glass plate) by sputtering the Cr-target 620 in a gas atmosphere comprising Ar gas supplied from the gas reservoir 648 by opening the valves 638, 641 and 642 while regulating the inner pressure to a predetermined value. Then the substrate having the Cr film as the electrode layer 702 thereon was transferred into the film-forming vacuum chamber, wherein an about 6000 Å thick a-Si film as the semiconductor layer 703 was formed on the previously formed Cr electrode layer 702 by practicing the foregoing film-forming process of the present invention, comprising repeating the film-forming cycle comprising the step (a) of depositing an a-Si film using $SiH_4$ gas and Ar gas and the step (b) of irradiating plasma of Ar gas (inert gas) to the a-Si film. The film-forming cycle was repeated 200 times. The respective repetition step (a) was performed for 10 seconds as for the $t_D$ by causing glow discharge in a gas atmosphere comprising $SiH_4$ gas and Ar gas while introducing $SiH_4$ gas from the reservoir 650 at a flow rate of 20 sccm and Ar gas from the reservoir 648 at a flow rate of 10 sccm and applying high frequency power of 20 W under the conditions of 350° C. (which is higher than the transition temperature which was found to be 300° C. in this case) as for the substrate temperature and 0.1 Torr as for the inner pressure, to thereby an a-Si film of 30 Å in mean thickness. The respective repetition step (b) was performed for 30 seconds as for the $t_A$ by causing glow discharge in a gas atmosphere comprising Ar gas while introducing Ar gas from the reservoir 648 at a flow rate of 10 sccm and applying high frequency power of 20 W under the conditions of 350° C. (which is higher than the transition temperature of 300° C.) as for the substrate temperature and 0.1 Torr as for the inner pressure, to thereby irradiate Ar gas plasma to the a-Si film formed in the antecedent repetition step (a). Thereafter, the substrate was transferred into the film-forming vacuum chamber 602 wherein an ITO film as the transparent and conductive layer 704 was formed on the previously formed a-Si semiconductor layer 703 by sputtering the ITO-target in a gas atmosphere comprising Ar gas and $O_2$ gas while maintaining the substrate at a temperature of 150° C. and while introducing Ar gas from the reservoir 648 and $O_2$ gas from the reservoir 651 at the respective predetermined flow rates. The resultant was then transferred into the substrate taking-out vacuum chamber 604, and after closing the gate valve 608, the resultant was cooled and taken out from the substrate taking-out vacuum chamber. The resultant was subjected to patterning by means of photolithography. The patterned sample thus obtained was wired to a driving circuit by way of bonding to thereby obtain a schottky-barrier type image-reading sensor.

In the above, prior to forming the a-Si layer in the film-forming vacuum chamber 601, the temperature distribution of the substrate having been heated to 350° C. was examined. As a result, there was a temperature difference of 58° C. between the temperature at the side end portion and that at the central portion of the substrate.

As for the resultant image-reading sensor, sensitivity, dark current, residual image and reduction in sensitivity by light irradiation were evaluated with respect to each of the constituent elements situated at the opposite side positions and the constituent element situated at the central position. As a result, no distinguishable difference was found among these elements observed with respect to any of the evaluation items. And no distinguishable reduction was observed as for the sensitivity even after the irradiation of light having a strong intensity.

Independently, the above procedures were repeated, except that the formation of the a-Si film in the film-forming vacuum chamber 601 was carried out in a conventional manner without performing the foregoing film formation cycle and while maintaining the substrate at a temperature of 250° C., to thereby obtain a comparative schottky-barrier type image-reading sensor.

In the above, prior to forming the a-Si layer in the film-forming vacuum chamber 601, the temperature distribution of the substrate having been heated to 250° C. was examined. As a result, there was a temperature difference of 30° C. between the temperature at the side end portions and that at the central portion of the substrate.

As for the resultant comparative image-reading sensor, sensitivity, dark current, and residual image were evaluated with respect to each of the constituent elements situated at the opposite side positions and the constituent element situated at the central position. As a result, there were found a distinguishable variation of 10% for the sensitivity, 15% for the dark current, and 23% for the residual image among these constituent elements observed. And each of the constituent elements was exposed to light having a strong intensity in order to evaluate the situation of reduction in the sensitivity. As a result, there was observed a distinguishable deterioration in the sensitivity as for each of the constituent elements.

Example 2 and Comparative Examples 1 to 3

Figure 8:
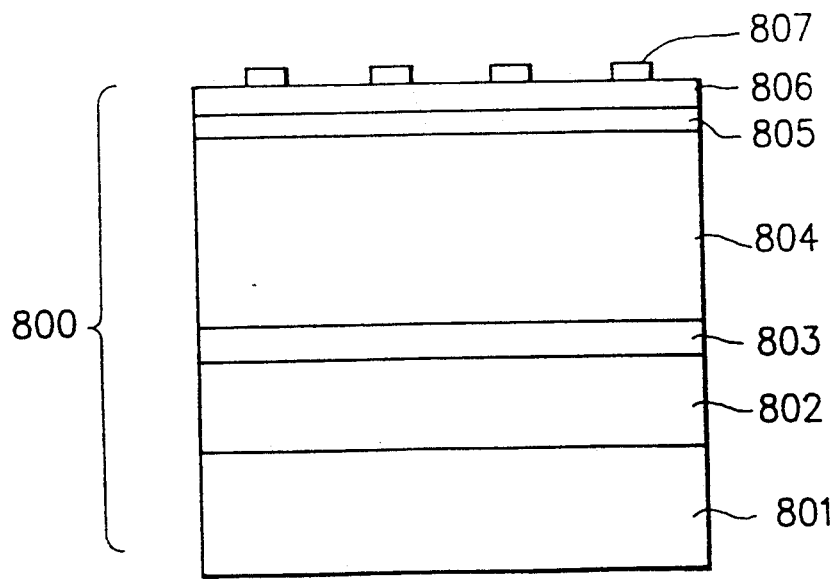
FIG. 8 is a schematic cross-section view illustrating the constitution of a pin junction photovoltaic element formed according to the process of the present invention.

There was prepared a pin junction photovoltaic element of the configuration shown in FIG. 8 in each of Example 2 and Comparative Examples 1 to 3.

In FIG. 8, numeral reference 800 stands for the entire of a pin junction photovoltaic element. The pin junction photovoltaic element 800 shown in FIG. 8 comprises a substrate 801, a lower electrode 802 disposed on the substrate, an n-type semiconductor layer 803 disposed on the lower electrode, an i-type semiconductor layer 804 disposed on the n-type semiconductor layer, a p-type semiconductor layer 805 disposed on the n-type semiconductor layer, an upper electrode 806 disposed on the p-type semiconductor layer and a collecting electrode 807 disposed on the upper electrode.

Example 2

Figure 9:
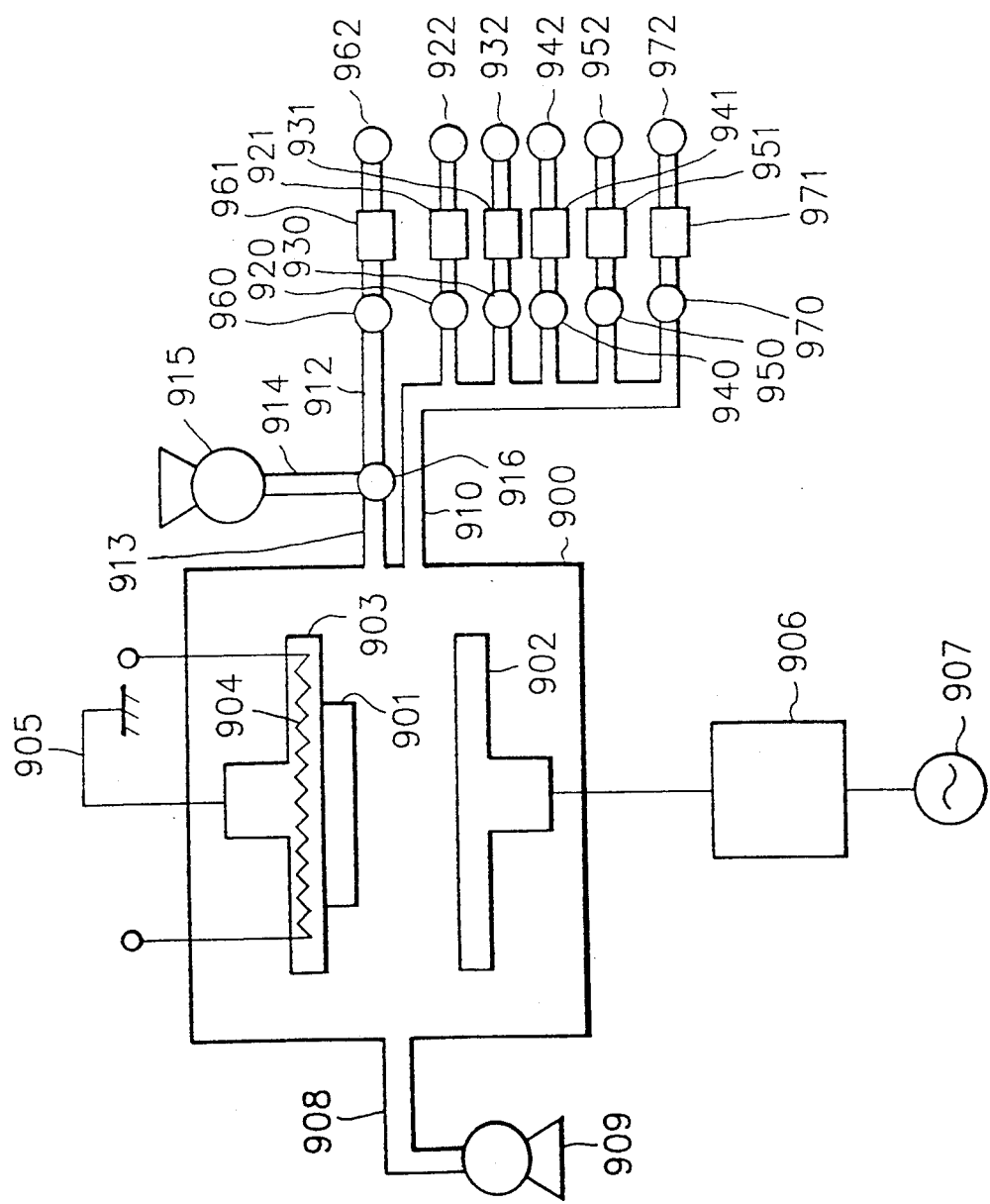
FIG. 9 is a schematic diagram of another example of the film-forming apparatus which is suitable for practicing the process of the present invention.

There was prepared a pin junction photovoltaic element of the configuration shown in FIG. 8, using the plasma CVD apparatus shown in FIG. 9. The plasma CVD apparatus shown in FIG. 9 comprises a conventional plasma CVD apparatus provided with an additional gas exhaust system which serves to stabilize gas flow in the gas pipe line.

In FIG. 9, numeral reference 900 stands for a reaction chamber, and numeral reference 901 stands for a substrate placed on a substrate holder 903 which serves also as an anode electrode. The substrate holder 903 is electrically grounded through wiring 905. The substrate holder 903 is provided with an electric heater 904. Numeral reference 902 stands for a cathode electrode which is extending from a RF power source of 13.56 MHz through a matching box 906. The reaction chamber 900 is provided with an exhaust pipe 908 connected to an exhaust pump 909. Each of numeral references 910, 912 and 913 stands for a gas supply pipe. Numeral reference 916 stands for a three-way valve disposed between the gas supply pipe 912 and the gas supply pipe 913. The three-way valve 916 is connected through an exhaust pipe 914 to an exhaust pump 915. Each of numeral references 922, 932, 942, 952, 962 and 972 stands for an inlet valve for a raw material gas from a gas reservoir (not shown). Each of numeral references 921, 931, 941, 951, 961 and 971 stands for a mass flow controller. Each of numeral references 920, 930, 940, 950, 960 and 970 stands for an exit valve.

In the above plasma CVD apparatus, the gas pipe way can be connected to either the gas supply pipe 913 or the exhaust pipe 914 by switching the three-way valve 916. When the gas pipe way is connected to the gas supply pipe 913 by switching the three-way valve 916, a raw material gas supplied through the gas pipe way 912 is introduced into the reaction chamber 900. On the other hand, when the gas pipe way is connected to the exhaust pipe 914 by switching the three-way valve 916, a raw material gas supplied through the gas pipe way 912 is exhausted outside the reaction chamber 900 through the exhaust pipe 914 by the action of the exhaust pump 915. In the case where the gas pipe way is connected to either the gas supply pipe 913 or the exhaust pipe 914 by switching the three-way valve 916, the mass flow controller 961 normally works since the gas pressure in the pipe way 912 is lower than the atmospheric pressure. Further, in any case, no additional gas residue is occurred in the gas pipe way and because of this, the introduction of a raw material gas into the reaction chamber 900 at a predetermined flow rate is secured when the gas pipe way is connected to the gas supply pipe 913 by switching the three-way valve 916.

The pin junction photovoltaic element of the configuration shown in FIG. 8 was prepared using the above plasma CVD apparatus as follows.

Firstly, there was provided a well-cleaned stainless steel plate of SUS 304 (trademark name) of 5 cm × 5 cm in size and having a leveled surface of 0.05 μm in Rmax as the substrate 801.

The stainless steel plate as the substrate 801 was placed in a conventional sputtering apparatus (not shown) and the inside of the sputtering apparatus was evacuated to about $10^{-7}$ Torr. Then, Ar gas was introduced into the sputtering apparatus, and the inner pressure was controlled to 5 mtorr. DC plasma was caused with a power of 200 W to sputter an Ag-target, whereby forming an about 5000 Å thick Ag film on the substrate. Successively, using the same sputtering apparatus, there was formed an about 5000 Å thick ZnO film on the Ag film. That is, the above procedures of forming the Ag film were repeated, except that the Ag-target was replaced by a ZnO-target, to thereby form said ZnO film on the Ag film. Thus, there was formed the lower electrode layer 802 on the stainless steel plate as the substrate 801.

The substrate 801 was introduced into the reaction chamber 900 of the plasma CVD apparatus shown in FIG. 9 and it was placed on the substrate holder 903. The inside of the reaction chamber 900 was evacuated to a vacuum of about $10^{-6}$ Torr by driving the exhaust pump 909. The electric heater 904 was actuated to heat the substrate 801 (the substrate 901 in FIG. 9) to 350° C., and the substrate was maintained at this temperature. The exit valve 920 and the inlet valve 922 were opened to introduce $SiH_4$ gas from a $SiH_4$ gas reservoir (not shown) through the gas supply pipe 910 into the reaction chamber 900 at a flow rate of 30 sccm while regulating the flow rate by the mass flow controller 921. At the same time, the exit valve 930 and the inlet valve 932 were opened to introduce $H_2$ gas from a $H_2$ gas reservoir (not shown) through the gas supply pipe 910 into the reaction chamber 900 at a flow rate of 30 sccm while regulating the flow rate by the mass flow controller 931. Further, the exit valve 950 and the inlet valve 952 were opened to introduce $PH_3$ gas (diluted with $H_2$ gas to 5%) (hereinafter referred to as $PH_3/H_2$ gas) from a $PH_3/H_2$ gas reservoir (not shown) through the gas supply pipe 910 into the reaction chamber 900 at a flow rate of 10 sccm while regulating the flow rate by the mass flow controller 951.

The inner pressure of the reaction chamber 900 was controlled to 1.5 Torr by the action of the exhaust pump 909. Then, the RF power source 907 was switched on to apply a RF power of 10 W through the matching box 906 between the anode electrode 903 (the substrate holder) and the cathode electrode 902, to thereby cause plasma discharge for 3 minutes, whereby forming a 400 Å thick n-typ a-Si:H:P film to be the n-type semiconductor layer 803 on the lower electrode layer 802.

After the formation of the n-type semiconductor layer 803 having been completed, the application of the RF power and the introduction of the three gases were terminated. The inside of the reaction chamber 900 was evacuated to a vacuum of about $10^{-6}$ Torr.

The substrate was maintained at 350° C. Then, the exit valve 970 and the inlet valve 972 were opened to introduce He gas from a He gas reservoir (not shown) through the gas supply pipe 910 into the reaction chamber 900 at a flow rate of 20 sccm while regulating the flow rate by the mass flow controller 971. Concurrently, after the pipe way 912 having been connected to the exhaust pipe 914 by switching the three-way valve 916, the exit valve 960 and the inlet valve 962 were open to flow $SiH_4$ gas into the pipe way 912 from a $SiH_4$ gas reservoir (not shown) at a flow rate of 30 sccm. Maintaining this state, the RF power source 907 was switched on to apply a RF power of 20 W between the anode electrode 903 (the substrate holder) and the cathode electrode 902 to cause plasma discharge generating plasma of the He gas (that is, He gas plasma) between the anode electrode 903 (the substrate holder) and the cathode electrode 902. After confirming that said He gas plasma was generated, the pipe way 912 was connected to the gas supply pipe 913 by switching the three-way valve 916, to thereby introduce $SiH_4$ gas into the reaction chamber 900 at a flow rate of 30 sccm for 30 seconds. Then, the pipe way 912 was connected to the exhaust pipe 914 by switching the three-way valve 916, to thereby suspend the introduction of the $SiH_4$ gas into the reaction chamber 900. After this state having been maintained for 40 seconds, the pipe way 912 was connected to the gas supply pipe 913 by switching the three-way valve 916, to thereby resume the introduction of the $SiH_4$ gas into the reaction chamber 900 at a flow rate of 30 sccm. After this state having been maintained for 10 seconds, the pipe way 912 was connected to the exhaust pipe 914 by switching the three-way valve 916, to thereby suspend the introduction of the $SiH_4$ gas into the reaction chamber 900 for 40 seconds. The repetition of performing alternately the step of introducing the $SiH_4$ gas into the reaction chamber 900 for 10 seconds and the step of suspending the introduction of the $SiH_4$ gas into the reaction chamber 900 for 40 seconds was conducted 200 times. As a result, there was formed a 6000 Å thick i-type a-Si:H semiconductor film to be the n-type semiconductor layer 804 on the previously formed n-type a-Si:H:P film as the n-type semiconductor layer 803.

After the formation of the i-type semiconductor layer 804 having been completed, the application of the RF power and the introduction of the three gases were terminated.

The inside of the reaction chamber 900 was evacuated to a vacuum of about $10^{-6}$ Torr. The substrate was maintained at 200° C. The exit valve 920 and the inlet valve 922 were opened to introduce SiH$_4$ gas from a SiH$_4$ gas reservoir (not shown) through the gas supply pipe 910 into the reaction chamber 900 at a flow rate of 1 sccm while regulating the flow rate by the mass flow controller 921. At the same time, the exit valve 930 and the inlet valve 932 were opened to introduce H$_2$ gas from a H$_2$ gas reservoir (not shown) through the gas supply pipe 910 into the reaction chamber 900 at a flow rate of 300 sccm while regulating the flow rate by the mass flow controller 931. Further, the exit valve 940 and the inlet valve 942 were opened to introduce B$_2$H$_6$ gas (diluted with H$_2$ gas to 5%) (hereinafter referred to as B$_2$H$_6$/H$_2$ gas) from a B$_2$H$_6$/H$_2$ gas reservoir (not shown) through the gas supply pipe 910 into the reaction chamber 900 at a flow rate of 10 sccm while regulating the flow rate by the mass flow controller 941.

The inner pressure of the reaction chamber 900 was controlled to 1.5 Torr by the action of the exhaust pump 909. Then, the RF power source 907 was switched on to apply a RF power of 200 W through the matching box 906 between the anode electrode 903 (the substrate holder) and the cathode electrode 902, to thereby cause plasma discharge for 5 minutes, whereby forming a 100 Å thick p-typ microcrystalline SI:H:B film to be the p-type semiconductor layer 805 on the previously formed i-type semiconductor layer 804. (As for the SI:H:B film, it was confirmed to be microcrystalline by separately forming a silicon film under the same conditions under which the said p-type semiconductor film and examining the crystallinity thereof by RHEED.)

The resultant obtained in the above was taken out from the reaction chamber 900 and it was transferred into a conventional resistance heating evaporation apparatus. The inside of the resistance heating evaporation apparatus was evacuated to about $10^{-7}$ Torr. Then, the substrate was maintained at 160° C. O$_2$ gas was introduced thereinto, and the inner pressure was controlled to 0.5 mtorr. An alloy composed of In and Sn was evaporated by means of resistance heating, to thereby form a 700 Å thick ITO film to be the upper electrode 806 capable of serving also to provide reflection preventive effects on the previously formed p-type semiconductor layer 805. The resultant thus obtained was transferred into a conventional dry etching apparatus, wherein it was divided to obtain 25 element samples of 1 cm × 1 cm in size. As for each of the resultant samples, an aluminium collecting electrode was formed on the upper electrode 806 by means of a conventional electron beam evaporation technique. Thus, there were obtained 25 pin junction photovoltaic element samples (Sample No. 1).

Comparative Example 1

The procedures of Example 2 were repeated, except that the formation of the i-type semiconductor layer 804 was carried out by a conventional manner wherein SiH$_4$ gas was introduced through through the gas supply pipe 910 into the reaction chamber 900 at a flow rate of 30 sccm and RF glow discharge was caused for 200 seconds in the same manner as in the case of forming the n-type semiconductor layer in Example 2, to thereby obtain 25 comparative pin junction photovoltaic element samples (Sample No. 2).

Comparative Example 2

The procedures of Example 2 were repeated, except that the substrate temperature upon forming the i-type semiconductor layer 804 was changed from 350° C. to 250° C., to thereby obtain 25 comparative pin junction photovoltaic element samples (Sample No. 3).

Comparative Example 3

The procedures of Comparative Example 2 were repeated, except that the substrate temperature upon forming the i-type semiconductor layer 804 was changed from 350° C. to 250° C., to thereby obtain 25 comparative pin junction photovoltaic element samples (Sample No. 4).

Evaluation

As for each of Samples Nos. 1 to 4 obtained in Example 2 and Comparative Examples 1 to 3 each comprising 25 photovoltaic element samples, initial photoelectric conversion efficiency, deterioration ratio thereof, and hydrogen content of the i-type semiconductor layer were evaluated respectively in the following evaluation manner. Evaluation of the initial photoelectric conversion efficiency A voltage-current characteristic curve is obtained on the basis of the results obtained by subjecting the pin photovoltaic element sample to irradiation of pseudo sun light of AM-1.5 with 100 mw/cm$^2$ in intensity by using a solar cell simulator. And an initial photoelectric conversion efficiency $\eta(0)$ is obtained based on the resultant voltage-current characteristic curve. Evaluation of the ratio of deterioration with respect to the initial photoelectric conversion efficiency.

On the basis of the value of open-circuit voltage and the value of short-circuit current obtained at the time of obtaining the above voltage-current characteristic curve, an optimum load is calculated. A prescribed load resistance is connected to the photovoltaic element sample. The photovoltaic element sample to which the prescribed load resistance being connected is placed on a sample table being maintained at 25° C., and it is subject to irradiation of pseudo sun light of AM-1.5 with 100 mw/cm$^2$ in intensity continuously for 500 hours. And a photoelectric conversion efficiency $\eta$ (500) after the irradiation of pseudo sun light of AM-1.5 with 100 mw/cm$^2$ in intensity continuously for 500 hours is obtained in the same manner as in the case of obtaining the initial photoelectric conversion efficiency. On the basis of the value of the foregoing $\eta(0)$ and the $\eta(500)$, the ratio of deterioration $(1-\eta(500)/\eta(0))$ is obtained. Evaluation of the hydrogen content of the i-type semiconductor layer The hydrogen content of the i-type semiconductor layer is measured by SIMS.

As for the evaluated result of each of the initial photoelectric conversion efficiency $\eta(0)$, the ratio of deterioration in photoelectric conversion efficiency and the hydrogen content of the i-type semiconductor layer with respect to the 25 photovoltaic element samples of each of Samples Nos. 1 to 4, a mean value was obtained among the 25 photovoltaic element samples.

The evaluated results obtained were collectively shown in Table 1, in which the evaluated value of the initial photoelectric conversion efficiency and the evaluated value of the ratio of deterioration in photoelectric conversion efficiency with respect each of Samples Nos. 1 to 3 are values relative to those with respect to Sample No. 4 which are made to be 1 respectively.

As the results of Table 1 illustrate, it is understood that the pin junction photovoltaic element obtained in Example 2 of the present invention is surpassing any of the comparative pin junction photovoltaic elements obtained in Comparative Examples 1 to 3 with respect to any of the evaluation items. Particularly, the pin junction photovoltaic element obtained in Example 2 of the present invention is markedly surpassing any of the comparative pin junction photovoltaic elements obtained in Comparative Examples 1 to 3 with respect to the ratio of deterioration in photoelectric conversion efficiency.

Separately, the procedures of each of Example 2 and Comparative Examples 1 to 3 for forming the i-type semiconductor layer were repeated to a silicon film on a glass plate to be used for Raman spectroscopic analysis. Each of the resultant silicon film samples was subjected to Raman spectroscopic analysis. As a result, there was observed a specific broad peak near 480 cm$^{-1}$ indicating amorphous silicon film in each case.

Example 3

Figure 10:
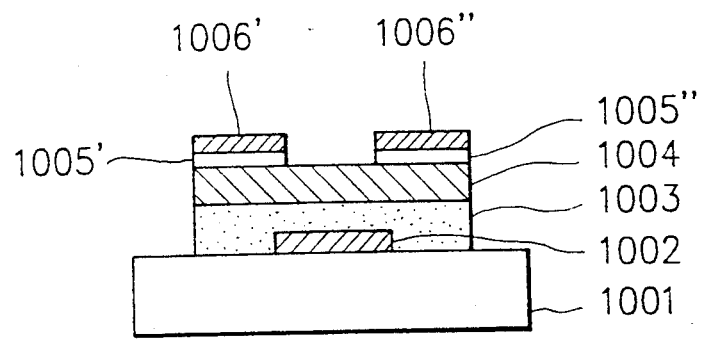
FIG. 10 is a schematic cross-section view illustrating the constitution of a field effect thin film transistor formed according to the process of the present invention.

There was prepared a field effect thin film transistor of the configuration shown in FIG. 10, using the plasma CVD apparatus shown in FIG. 9.

The field effect thin film transistor shown in FIG. 10 comprises an insulating substrate 1001, a gate electrode 1002 in a desired pattern formed on the insulating substrate, an insulating layer 103, a semiconductor layer 1004, ohmic contact layers 1005' and 1005", and main electrodes 1006' and 1006".

The field effect thin film transistor was prepared as follows.

Firstly, on a well-cleaned glass plate (Corning glass plate No. 7059 produced by Corning Glass Company) as the substrate 1001 was formed an aluminum film to be the gate electrode 1002 by means of a conventional evaporation technique. The substrate was introduced into the reaction chamber 900 of the plasma CVD apparatus shown in FIG. 9 and it was placed on the substrate holder 903 capable of serving also as the anode electrode as shown by the numeral reference 901 in FIG. 9. The inside of the reaction chamber 900 was evacuated to a vacuum of about 10$^{-6}$ Torr. The electric heater 904 was actuated to heat the substrate to 350° C., and the substrate was maintained at this temperature. Then, NH$_3$ gas, H$_2$ gas and Ar gas were introduced into the reaction chamber 900 through the gas supply pipe 910 at the respective flow rates of 150 sccm, 10 sccm and 10 sccm. The inner pressure of the reaction chamber 900 was controlled to and maintained at 0.4 Torr by the action of the exhaust pump 909. The RF power source was switched on to apply a RF power of 10 W between the anode electrode 903 (the substrate holder) and the cathode electrode 902 through the matching box 906 to cause plasma of a mixture of NH$_3$ gas, H$_2$ gas and Ar gas, wherein the step of introducing Si$_2$H$_6$ gas through the gas supply pipe 913 into the reaction chamber 900 at a flow rate of 20 sccm for 20 seconds while connecting the pipe way 912 to the gas supply pipe 913 by switching the three-way valve 916 and the step of suspending the introduction of said Si$_2$H$_6$ gas into the reaction chamber 900 for 40 seconds while connecting the pipe way 912 to the exhaust pipe 914 by switching the three-way valve 916 were alternately performed 100 times, whereby forming an about 1500 Å thick a-SiN:H film to be the insulating layer 103 on the substrate 1001 having the aluminum gate electrode 1002 thereon.

After the formation of the insulating layer 1003 having been completed, the application of the RF power and the introduction of the raw material gases were terminated. The inside of the reaction chamber 900 was evacuated to a vacuum of about 10$^{-6}$ Torr. The substrate was maintained at 350° C. Then, Ar gas was introduced through the gas supply pipe 910 into the reaction chamber 900 at a flow rate of 10 sccm. The inner pressure of the reaction chamber 900 was controlled to and maintained at 0.3 Torr by regulating the exhaust pump 909. The RF power source 907 was witched on to apply a RF power of 10 W between the anode electrode 903 (the substrate holder) and the cathode electrode 902 to cause plasma of Ar gas, wherein the step of introducing Si$_2$H$_6$ gas through the gas supply pipe 913 into the reaction chamber 900 at a flow rate of 20 sccm for 5 seconds while connecting the pipe way 912 to the gas supply pipe 913 by switching the three-way valve 916 and while applying a RF power 3 W between the anode 903 (the substrate holder) and the cathode 902 and the step of suspending the introduction of said Si$_2$H$_6$ gas into the reaction chamber 900 for 40 seconds while connecting the pipe way 912 to the exhaust pipe 914 by switching the three-way valve 916 and while applying a RF power 10 W between the anode 903 (the substrate holder) and the cathode 902 were alternately performed 25 times, whereby forming an about 50 Å thick non-doped a-Si:H film to be the semiconductor layer 1004 on the previously formed insulating layer 1003.

After the formation of the semiconductor layer 1004 having been completed, the application of the RF power and the introduction of the raw material gases were terminated. The inside of the reaction chamber 900 was evacuated to a vacuum of about 10$^{-6}$ Torr. The substrate was maintained at 350° C. Then, Ar gas was introduced through the gas supply pipe 910 into the reaction chamber 900 at a flow rate of 30 sccm. The inner pressure of the reaction chamber 900 was controlled to and maintained at 0.3 Torr by regulating the exhaust pump 909. The RF power source 907 was witched on to apply a RF power of 10 W between the anode electrode 903 (the substrate holder) and the cathode electrode 902 to cause plasma of Ar gas, wherein the step of introducing Si$_2$H$_6$ gas containing 1000 ppm of PH$_3$ through the gas supply pipe 913 into the reaction chamber 900 at a flow rate of 20 sccm for 5 seconds while connecting the pipe way 912 to the gas supply pipe 913 by switching the three-way valve 916 and while applying a RF power of 10 W between the anode 903 (the substrate holder) and the cathode 902 and the step of suspending the introduction of said Si$_2$H$_6$ gas into the reaction chamber 900 for 40 seconds while connecting the pipe way 912 to the exhaust pipe 914 by switching the three-way valve 916 and while applying a RF power 10 W between the anode 903 (the substrate holder) and the cathode 902 were alternately performed 17 times, whereby forming an about 500 Å thick n$^+$-type a-Si:H:P film to be the ohmic contact layer 1005 on the previously formed semiconductor layer 1004.

After the formation of the n$^+$-type a-Si:H:P film having been completed, the introduction of the raw material gases and the application of the RF power were terminated, and the electric heater was switched off. Then, the resultant was taken out from the reaction chamber. On the layer comprising the n+-type a-Si:H:P film was formed an aluminium film to be the main electrode 106 by means of a conventional evaporation technique. The resultant was subjected to patterning by photolithography to remove the channel-forming portion of each of the n+-type a-Si:H:P film and the aluminum film, whereby forming the ohmic contact layers 1005' and 1005'' and the main electrodes 1006' and 1006'' with W/L=100, with W being a channel width and L being a channel length.

Thus, there was obtained a field effect thin film transistor of the configuration shown in FIG. 10.

Separately, the above procedures of forming the field effect thin film transistor were repeated, except that the formation of the respective silicon-containing films was carried out without performing the step of suspending the introduction of $Si_2H_6$ gas, to thereby obtain a comparative field effect thin film transistor.

As for each of the two field effect thin film transistors, the transistor characteristics were evaluated by a conventional evaluation method. As a result, it was found that the field effect thin film transistor obtained in the example of the present invention is surpassing the comparative field effect thin film transistor by more than one figure with respect to the moving bed. Further, the shift of Vth upon application of a bias voltage was reduced to less than 1/10 in the case of the field effect thin film transistor obtained in the example of the present invention. In consequence, it was found that the field effect thin film transistor obtained in the example of the present invention provides improved transistor characteristics which are superior to those provided by the comparative field effect thin film transistor.

Example 4

There were prepared a plurality of a-Si film samples in the manner similar to that in Example 1 for forming the a-Si semiconductor film.

(1) The procedures of Example 1 for forming the a-Si semiconductor film were repeated, except that the film-forming conditions were changed to 320° C. as for the substrate temperature, 0.1 Torr as for the inner pressure, 20 W as for the RF power applied, 10 seconds as for the repetition step (a), 40 seconds as for the repetition step (b), 20 sccm as for the flow rate of the $SiH_4$ gas, 10 sccm as for the flow rate of the Ar gas, and the repetition step (a) and the repetition step (b) were repeated alternately 300 times, to thereby form an about 9000 Å thick a-Si film on a well cleaned glass plate (hereinafter referred to as a-Si film sample A).

(2) The procedures of Example 1 for forming the a-Si semiconductor film were repeated, except that the film-forming conditions were changed to 370° C. as for the substrate temperature, 0.1 Torr as for the inner pressure, 20 W as for the RF power applied, 10 seconds as for the repetition step (a), 40 seconds as for the repetition step (b), 20 sccm as for the flow rate of the $SiH_4$ gas, 10 sccm as for the flow rate of the Ar gas, and the repetition step (a) and the repetition step (b) were repeated alternately 300 times, to thereby form an about 9000 Å thick a-Si film on a well cleaned glass plate (hereinafter referred to as a-Si film sample B).

As for each of the a-Si film samples A and B, the photoelectric conductivity at the side end portions and that at the central portion by disposing an Al comb-shaped electrode of 250 μm in gap width on each of those portions by means of a conventional electron beam evaporation technique and measuring the photoconductivity at each of those portions.

As a result, there was not a distinguishable difference with respect to the photoconductivity among those portions examined as for each of the a-Si film samples A and B. And each of the a-Si film samples A and B exhibited a photoconductivity of $10^{-4}$ to $10^{-5}$ s/cm, which means that each of the a-Si film samples A and B excels in the film property.

Further, it was found that each of the a-Si film samples A and B is free of light deterioration.

In addition, as for each of the a-Si film samples A and B, the crystallinity was examined by Raman spectroscopic analysis. As a result, it was found that each of the a-Si film samples A and B has a specific peak only near 480 cm$^{-1}$ but not near 520 cm$^{-1}$.

(3) The film-forming procedures of the above (1) were repeated, except that the formation of the a-Si film was performed on each of Si-wafers of 1 inch in diameter disposed at the central position and the side end positions of the glass plate as the substrate, to thereby obtain a plurality of a-Si film samples formed on the respective Si-wafers. As for each of the resultant a-Si film samples, the hydrogen content was examined by SIMS. As a result, it was found that each of the resultant a-Si film samples contains about 5 atomic %.

(4) The film-forming procedures of the above (2) were repeated, except that the formation of the a-Si film was performed on each of Si-wafers of 1 inch in diameter disposed at the central position and the side end positions of the glass plate as the substrate, to thereby obtain a plurality of a-Si film samples formed on the respective Si-wafers. As for each of the resultant a-Si film samples, the hydrogen content was examined by SIMS. As a result, it was found that each of the resultant a-Si film samples contains about 5 atomic %.

For comparison purposes, there were prepared a plurality of comparative a-Si film samples, and the hydrogen content of each of the resultant comparative a-Si film samples as will be described in the following.

(i) The procedures of the above (1) were repeated, except that the formation of the a-Si film was carried out without performing the step of suspending the introduction of the $SiH_4$ gas, to thereby form an about 9000 Å thick a-Si film on a well cleaned glass plate (hereinafter referred to as comparative a-Si film sample A').

(ii) The procedures of the above (2) were repeated, except that the formation of the a-Si film was carried out without performing the step of suspending the introduction of the $SiH_4$ gas, to thereby form an about 9000 Å thick a-Si film on a well cleaned glass plate (hereinafter referred to as comparative a-Si film sample B').

As for each of the comparative a-Si film samples A' and B', the photoconductivity at the side end portions and that at the central portion by disposing an Al comb-shaped electrode of 250 μm in gap width on each of those portions by means of a conventional electron beam evaporation technique and measuring the photoconductivity at each of those portions.

As a result, there was a distinguishable difference with respect to the photoconductivity among those portions examined as for each of the comparative a-Si film samples A' and B'. And each of the comparative a-Si film samples A' and B' did not exhibit a satisfactory photoconductivity.

Further, it was found that each of the comparative a-Si film samples A' and B' is accompanied by distinguishable light deterioration.

(iii) The film-forming procedures of the above (i) were repeated, except that the formation of the a-Si film was performed on each of Si-wafers of 1 inch in diameter disposed at the central position and the side end positions of the glass plate as the substrate, to thereby obtain a plurality of comparative a-Si film samples formed on the respective Si-wafers. As for each of the resultant comparative a-Si film samples, the hydrogen content was examined by SIMS. As a result, it was found that each of the resultant comparative a-Si film samples contains about 11 atomic (iv) The film-forming procedures of the above (ii) were repeated, except that the formation of the a-Si film was performed on each of Si-wafers of 1 inch in diameter disposed at the central position and the side end positions of the glass plate as the substrate, to thereby obtain a plurality of comparative a-Si film samples formed on the respective Si-wafers. As for each of the resultant comparative a-Si film samples, the hydrogen content was examined by SIMS. As a result, it was found that each of the resultant comparative a-Si film samples contains about 7 atomic %.

(v) The procedures of the above (1) were repeated, except that the period of time (that is, the $t_D$) during which the repetition step (a) is to be performed was changed to 2 seconds, to thereby form an about 9000 Å thick comparative a-Si film on a glass plate (hereinafter referred to as comparative a-Si sample C).

(vi) The procedures of the above (2) were repeated, except that the period of time (that is, the $t_D$) during which the repetition step (a) is to be performed was changed to 2 seconds, to thereby form an about 9000 Å thick comparative a-Si film on a glass plate (hereinafter referred to as comparative a-Si sample D).

As for each of the comparative a-Si film samples C and D, the crystallinity was examined by Raman spectroscopic analysis. As a result, it was found that each of the comparative a-Si film samples C and D has a strong peak only near 520 cm$^{-1}$ but an undistinguishable peak near 480 cm$^{-1}$. From this, it is considered that each of the comparative a-Si film samples C and D has been crystallized.

Example 5

(1) The procedures of Example 1 for forming the a-Si semiconductor film were repeated, except that the film-forming conditions were changed to 350° C. (higher than the transition temperature) as for the substrate temperature, 0.1 Torr as for the inner pressure, 20 W as for the RF power applied, 20 seconds as for the repetition step (a), 40 seconds as for the repetition step (b), 20 sccm as for the flow rate of the SiH$_4$ gas, 10 sccm as for the flow rate of the Ar gas, and the repetition step (a) and the repetition step (b) were repeated alternately 200 times while applying a bias voltage of −60 V to the substrate, to thereby form a 1.1 μm thick a-Si film on a glass plate and a Si-wafer (hereinafter referred to as a-Si film sample A).

(2) The procedures of the above (1) were repeated, except no bias voltage was applied to the substrate, to thereby form a 1.1 μm thick a-Si film on a glass plate and a Si-wafer (hereinafter referred to as a-Si film sample B).

As for each of the a-Si film samples A and B, the photoconductivity and the hydrogen content were examined.

As a result, it was found that the a-Si film A sample contains 5.5 atomic % of hydrogen atoms and exhibits an excellent photoconductivity and on the other hand, the a-Si film sample B contains 8 atomic % of hydrogen atoms which is lower than that of the a-Si film sample A and exhibits a photoconductivity which is lower as much as ⅓ over that of the a-Si film sample A. Further, as a result of examining light deterioration, it was found that the a-Si film sample A is markedly surpassing the a-Si film sample B.

Comparative Example 4

The procedures of Example 1 for forming the a-Si semiconductor film were repeated, except that the film-forming conditions were changed to 250° C. (lower than the transition temperature) as for the substrate temperature, 0.1 Torr as for the inner pressure, 20 W as for the RF power applied, 20 seconds as for the repetition step (a), 40 seconds as for the repetition step (b), 20 sccm as for the flow rate of the SiH$_4$ gas, 10 sccm as for the flow rate of the Ar gas, and the repetition step (a) and the repetition step (b) were repeated alternately 200 times while applying a bias voltage of −60 V to the substrate, to thereby form a 1.1 μm thick a-Si film on a glass plate and a Si-wafer.

The resultant a-Si film was examined with respect to the hydrogen content by SIMS. As a result, it was found that the hydrogen content is varied in the range of 8 to 13 atomic % between the side end portions and the central portion. And as a result of examining the photoconductivity, it was found that the photoconductivity is 10$^{-6}$ to 10$^{-7}$ s/cm, which is not satisfactory. Further, as a result of examining light deterioration, it was found that the a-Si film is accompanied by distinguishable light deterioration.

Example 6

There were prepared a plurality of a-Si film samples by repeating the procedures of Example 4-(1), except that the Ar gas was replaced by He gas, Ne gas, Kr gas or Xe gas, to thereby form an about 9000 Å thick a-Si film on a well cleaned glass plate in each case.

With respect to each of the resultant a-Si films, the photoconductivity was examined. As a result, each of them exhibited a satisfactory photoconductivity of 10$^{-5}$ to 10$^{-4}$ s/cm. Further, each of the resultant a-Si films was examined with respect to deterioration in the photoconductivity by exposing it to pseudo sun light of AM 1.5 with 100 mW in intensity for 130 hours. As a result, the initial photoconductivity was not substantially reduced.

TABLE 1

| | the condition for forming i-type semiconductor layer | | | | |
|---|---|---|---|---|---|
| photovoltaic element sample No. | introduction of SiH gas | substrate temperature (Ts) | initial photovoltaic conversion efficiency | deterioration ratio | hydrogen content of the i-type layer |
| No. 1 | intermittent | higher than Tt | 1.25 | 0.2 | 4 atomic % |

TABLE 1-continued

| photovoltaic element sample No. | the condition for forming i-type semiconductor layer | | initial photovoltaic conversion efficiency | deterioration ratio | hydrogen content of the i-type layer |
|---|---|---|---|---|---|
| | introduction of SiH gas | substrate temperature (Ts) | | | |
| (Example 2) No. 2 | continuous | higher than Tt | 0.9 | 0.85 | 10 atomic % |
| (Comparative example 1) No. 3 | intermittent | higher than Tt | 1.1 | 0.9 | 14 atomic % |
| (Comparative example 2) No. 4 (Comparative example 3) | continuous | higher than Tt | 1 | 1 | 15 atomic % |

What is claimed is:

1. A process for forming a silicon-containing amorphous film on a substrate which comprises (a) a step of depositing a silicon-containing amorphous film on said substrate and (b) a step of irradiating a plasma of inert gas to said silicon-containing amorphous film deposited on the substrate in said step (a), wherein said step (a) and said step (b) are alternately repeated while (i) controlling the thickness of said silicon-containing amorphous film deposited on each repetition of said step (a) to a thickness of at least 10 Å and (ii) maintaining the temperature of the substrate when irradiating a plasma of inert gas in step (b) to at least a transition temperature at which a marked reduction is caused in the content of hydrogen atoms contained in the silicon-containing amorphous film formed on the substrate.

2. The process according to claim 1, wherein the inert gas is selected from the group consisting of He gas, Ne gas, Av gas, Xe gas and Kr gas.

3. The process according to claim 1, wherein the thickness of the silicon-containing amorphous film deposited in each repetition of the step (a) is controlled to be 100 Å or less.

4. The process according to claim 1, wherein the substrate is electrically floated upon performing each repetition of the step (b).

5. The process according to claim 1, wherein a bias voltage is applied to the substrate upon performing each repetition of the step (b).

6. The process according to claim 5, wherein the bias voltage is a self-bias voltage provided by the plasma.

7. The process according to claim 1 wherein the substrate is maintained at a temperature which corresponds to the transition temperature at which a marked reduction is caused in the content of hydrogen atoms contained in the silicon-containing amorphous film formed on the substrate.

8. The process according to claim 1, wherein the substrate is maintained at a temperature which is higher than the transition temperature at which a marked reduction is caused in the content of hydrogen atoms contained in the silicon-containing amorphous film formed on the substrate.

9. The process according to claim 1, wherein the same inert gas used in each repetition of the step (b) is also used in each repetition of the step (a) together with film-forming raw material gas.

10. The process according to claim 9, wherein the concentration of the film-forming raw material gas used in each repetition of the step (a) is controlled to 30% or above.

11. The process according to claim 5, wherein the bias voltage is a negative bias voltage.

12. The process according to claim 11, wherein the thickness of the silicon-containing amorphous film to be formed in each repetition of the step (a) is controlled to a thickness in the range of 15 Å to 200 Å.

* * * * *

UNITED STATES PATENT AND TRADEMARK OFFICE
CERTIFICATE OF CORRECTION

PATENT NO. : 5,288,658
DATED : February 22, 1994
INVENTOR(S) : Shunichi Ishihara It is certified that error appears in the above-indentified patent and that said Letters Patent is hereby corrected as shown below:

ON TITLE PAGE

In [57] Abstract, "on" (first occurrence) should be deleted.

IN THE DRAWINGS

Sheet 2 of 7, "SPECTRAM" should read --SPECTRUM--.

COLUMN 1

Line 27, "polycystal" should read --polycrystal-- and "film" should read --film.
Line 28, "has." should be deleted and "Further" should read --Further,--.

COLUMN 2

Line 22, "an" should read --a--.
Line 40, "a" should read --an--.
Line 66, "films" should read --film--.
Line 67, "that is" should read --that it is--.

COLUMN 3

Line 2, "that are" should read --that they are--.
Line 8, "constituent" should read --is constituted by--.
Line 37, "that does" should read --that it does--.

COLUMN 5

Line 60, "entire of" should read --entirety--.
Line 65, "which" should read --which is--.

UNITED STATES PATENT AND TRADEMARK OFFICE
CERTIFICATE OF CORRECTION

PATENT NO. : 5,288,658
DATED : February 22, 1994
INVENTOR(S) : SHUNICHI ISHIHARA It is certified that error appears in the above-identified patent and that said Letters Patent is hereby corrected as shown below:

COLUMN 8

Line 25, "what" should read --what is--
    Line 37, "defects" should read --defects,--.
    Line 48, "$t_A;$" should read --$t_A$.--.
    Line 56, "what" should read --what is--.
    Line 57, "2; According" should read --2. Accordingly,--.
    Line 58, "film" should read --film,--.

COLUMN 9

Line 33, "film" should read --film,--.
    Line 42, "film" should read --film,--.
    Line 64, "what" should read --what is--.

COLUMN 10

Line 4, "capable" should read --capable of--.
    Line 17, "depend" should read --depends--.
    Line 44, "what" should read --what is--.

COLUMN 11

Line 60, "what" should read --what is--.
    Line 62, "the i" should read --the 1--.

COLUMN 12

Line 30, "mtorr" should read --m Torr--.
    Line 36, "(a))" should read --(a)--.

UNITED STATES PATENT AND TRADEMARK OFFICE
CERTIFICATE OF CORRECTION

PATENT NO. : 5,288,658
DATED : February 22, 1994
INVENTOR(S) : SHUNICHI ISHIHARA It is certified that error appears in the above-identified patent and that said Letters Patent is hereby corrected as shown below:

COLUMN 13

Line 3, "that" should read --that it--.
    Line 11, "can" should read --can be--.

COLUMN 14

Line 48, "pipying." should read --piping--.

COLUMN 15

Line 54, "schottky-barrier" should read --Schottky-barrier--.

COLUMN 16

Line 11, "schottky-barrier" should read --Schottky-barrier--.

COLUMN 17

Line 47, "mtorr." should read --m Torr.--.

COLUMN 18

Line 22, "n-typ" should read --n-type--.

COLUMN 19

Line 35, "p-typ" should read --p-type-- and "SI:H:B" should read --Si:H:B--.
    Line 38, "SI:H:B" should read --Si:H:B--.
    Line 49, "mtorr." should read --m Torr.--.
    Line 68, "through" (second occurrence) should be deleted.

UNITED STATES PATENT AND TRADEMARK OFFICE
CERTIFICATE OF CORRECTION

PATENT NO. : 5,288,658
DATED : February 22, 1994
INVENTOR(S) : SHUNICHI ISHIHARA It is certified that error appears in the above-identified patent and that said Letters Patent is hereby corrected as shown below:

COLUMN 20

Line 30, "manner. Evaluation" should read
--manner. ¶ Evaluation--.
Line 38, "curve. Evalua-" should read --curve. ¶ Evalua- --.

COLUMN 21

Line 5, "respect" should read --respect to--.
Line 45, "The-substrate" should read --The substrate--.

COLUMN 22

Line 5, "a-SiN:H" should read --a-Si:N:H--.
Line 18, "witched" should read --switched--.
Line 48, "witched" should read --switched--.

COLUMN 25

Line 14, "atomic" should read --atomic %--.

COLUMN 27

Line 31, "Av gas" should read --Ar gas--.

UNITED STATES PATENT AND TRADEMARK OFFICE
CERTIFICATE OF CORRECTION

PATENT NO.  : 5,288,658
DATED       : February 22, 1994
INVENTOR(S) : SHUNICHI ISHIHARA It is certified that error appears in the above-identified patent and that said Letters Patent is hereby corrected as shown below:

COLUMN 28

Line 7, "claim 1" should read --claim 1,--.

Signed and Sealed this

Twenty-seventh Day of September, 1994

Attest:

BRUCE LEHMAN

Attesting Officer

*Commissioner of Patents and Trademarks*